US012663519B2

(12) United States Patent
Tsukuda et al.

(10) Patent No.: US 12,663,519 B2
(45) Date of Patent: Jun. 23, 2026

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventors: Yasunori Tsukuda, Kanagawa (JP); Kyosuke Ito, Kanagawa (JP); Shohei Shimada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 948 days.

(21) Appl. No.: 17/906,126

(22) PCT Filed: Dec. 15, 2020

(86) PCT No.: PCT/JP2020/046693
§ 371 (c)(1),
(2) Date: Sep. 12, 2022

(87) PCT Pub. No.: WO2021/186817
PCT Pub. Date: Sep. 23, 2021

(65) Prior Publication Data
US 2023/0112018 A1    Apr. 13, 2023

(30) Foreign Application Priority Data

Mar. 18, 2020    (JP) ................................. 2020-047645

(51) Int. Cl.
*G01S 7/4863*        (2020.01)
*G01S 17/32*         (2020.01)
*H10F 39/00*         (2025.01)

(52) U.S. Cl.
CPC ............ *G01S 7/4863* (2013.01); *G01S 17/32* (2013.01); *H10F 39/80* (2025.01); *H10F 39/8037* (2025.01)

(58) Field of Classification Search
CPC ...... G01S 7/4863; G01S 17/32; G01S 17/931; G01S 7/4865; G01S 7/4868;
(Continued)

(56) References Cited

U.S. PATENT DOCUMENTS

2002/0008892 A1     1/2002   Okayasu
2015/0357357 A1 *  12/2015   Sargent .................. H04N 25/63
                                                                 257/448
(Continued)

FOREIGN PATENT DOCUMENTS

CN          105181132 A     12/2015
CN          105988118 A     10/2016
(Continued)

OTHER PUBLICATIONS

Translation of JP 2004363437 A (Year: 2004).*
(Continued)

*Primary Examiner* — Isam A Alsomiri
*Assistant Examiner* — Joseph C Fritchman
(74) *Attorney, Agent, or Firm* — CHIP LAW GROUP

(57)          ABSTRACT

In a solid-state imaging element that measures a distance on the basis of a light receiving timing of reflected light, the shortest distance that can be measured is shortened. A photoelectric conversion region generates charges through photoelectric conversion. A multiplication region multiplies the generated charges. An output electrode outputs the multiplied charges. A detection circuit detects the presence or absence of photons contained in reflected light with respect to radiation light on the basis of the charges output from the output electrode. An additional electrode dis- (Continued)

charges the charges from the photoelectric conversion region in a case where a predetermined potential is applied to the additional electrode. A control circuit applies the predetermined potential to the additional electrode at a radiation timing when the radiation light is radiated.

17 Claims, 26 Drawing Sheets

(58) Field of Classification Search
CPC ...... G01S 7/4876; G01S 17/14; G01S 17/894; H10F 39/8037; H10F 39/80; H10F 39/803
See application file for complete search history.

(56) References Cited

U.S. PATENT DOCUMENTS

| | | | |
|---|---|---|---|
| 2017/0194368 A1* | 7/2017 | Roy | H10F 39/8037 |
| 2017/0229599 A1 | 8/2017 | Sakata | |
| 2018/0246214 A1 | 8/2018 | Ishii | |
| 2019/0319154 A1* | 10/2019 | Fukuchi | H10F 39/107 |
| 2021/0257508 A1* | 8/2021 | Feick | H10F 77/206 |

FOREIGN PATENT DOCUMENTS

| | | | |
|---|---|---|---|
| CN | 106067791 | A | 11/2016 |
| CN | 109844952 | A | 6/2019 |
| EP | 1944571 | A1 | 7/2013 |
| EP | 3555919 | A1 | 10/2021 |
| JP | 2004-363437 | A | 12/2004 |
| JP | 2008135800 | A | 6/2008 |
| JP | 2009-158737 | A | 7/2009 |
| JP | 2016029492 | A | 3/2016 |
| JP | 2016058971 | A | 4/2016 |
| JP | 2020-016654 | A | 1/2020 |
| WO | WO-2016013170 | A1 | 1/2016 |
| WO | 2018/003227 | A1 | 1/2018 |
| WO | WO-2019180898 | A1 | 9/2019 |

OTHER PUBLICATIONS

Wang et al (HP), "On Synthesizing Memristor-Based Logic Circuits With Minimal Operational Pulses", IEEE Transactions on Very Large Scale Integration (VLSI) Systems, Dec. 28, 2018, pp. 1-11.
Zhang et al, "Design of drive circuit for continuously adjustable ns pulse LD", Laser Technology, Aug. 25, 2008. pp. 1-3, vol. 32, No. 4.
International Search Report and Written Opinion of PCT Application No. PCT/JP2020/046693, issued on Mar. 16, 2021, 09 pages of ISRWO.

* cited by examiner

SOLID-STATE IMAGING ELEMENT AND ELECTRONIC DEVICE

CROSS REFERENCE TO RELATED APPLICATIONS

This application is a U.S. National Phase of International Patent Application No. PCT/JP2020/046693 filed on Dec. 15, 2020, which claims priority benefit of Japanese Patent Application No. JP 2020-047645 filed in the Japan Patent Office on Mar. 18, 2020. Each of the above-referenced applications is hereby incorporated herein by reference in its entirety.

The present technology relates to a solid-state imaging element. In particular, the present technology relates to a solid-state imaging element that detects the presence or absence of photons and to an electronic device.

BACKGROUND ART

In the related art, a distance measurement method called a time of flight (ToF) method in an electronic device having a distance measurement function is known. This ToF method is a method of measuring a distance by irradiating an object with radiation light from an electronic device and obtaining a turnaround time until the radiation light is reflected and returned to the electronic device. A single-photon avalanche diode (SPAD) is often used as a photoelectric conversion element for detecting reflected light with respect to radiation light. For example, a distance measurement device in which a current from the SPAD flows through a resistor and a distance is obtained from a light receiving timing detected on the basis of a voltage drop between terminals of the resistor has been proposed (see, for example, PTL 1).

CITATION LIST

Patent Literature

[PTL 1]
WO 2018/003227

SUMMARY

Technical Problem

In the related art described above, weak light is detected using the SPAD that multiplies charges. However, in the distance measurement device, the radiation light may be reflected in the device and incident on the SPAD as stray light, resulting in a voltage drop. In this case, it is necessary to wait for the dropped voltage to recover to a predetermined value before performing distance measurement. However, the longer the time until the voltage recovers, the longer the shortest distance that can be measured, and thus there is a problem that it interferes with short-distance measurement.

The present technology is made in view of such a situation, and an object of the present technology is to shorten the shortest distance that can be measured in a solid-state imaging element that measures a distance on the basis of a light receiving timing of reflected light.

Solution to Problem

The present technology has been made to solve the above-mentioned problems, and a first aspect thereof is a solid-state imaging element including: a photoelectric conversion region that generates charges through photoelectric conversion; a multiplication region that multiplies the generated charges; an output electrode that outputs the multiplied charges; a detection circuit that detects the presence or absence of photons contained in reflected light with respect to radiation light on the basis of the charges output from the output electrode; an additional electrode that discharges the charges from the photoelectric conversion region in a case where a predetermined potential is applied; and a control circuit that applies the predetermined potential to the additional electrode at a radiation timing when the radiation light is radiated. This provides an effect that the charges are not output from the output electrode when stray light is incident.

Further, in this first aspect, the output electrode and the additional electrode may be cathodes, and the charges may be electrons. This provides an effect that the electrons are discharged from the additional electrode.

Further, in this first aspect, the detection circuit may include a current source, a transistor in which an enable signal is input to a gate, and a logic gate that outputs a pulse signal on the basis of a potential of a connection node between the current source and the transistor, the current source and the transistor may be connected in series between a power source node and a reference node, and the output electrode may be connected to the connection node. This provides an effect that the presence or absence of photons is detected.

Further, in this first aspect, the control circuit may apply the predetermined potential over a predetermined period to control the transistor to be in an on state with the enable signal over a period from a start timing of the predetermined period to a predetermined timing before an end timing of the predetermined period.

Further, this first aspect may further include a signal processing unit that calculates a distance on the basis of the pulse signal. This provides an effect that the shortest measurement distance is shortened.

Further, in this first aspect, the signal processing unit may acquire a reference distance on the basis of the pulse signal within a predetermined reference distance measurement period, calculate a distance on the basis of the pulse signal within a predetermined distance measurement period, and correct the distance on the basis of the reference distance. This provides an effect that the distance measurement accuracy is improved.

Further, in this first aspect, the photoelectric conversion region, the multiplication region, the output electrode, the detection circuit, and the additional electrode may be disposed in each of a reference pixel and a distance measurement pixel, and the signal processing unit may acquire a reference distance on the basis of the pulse signal from the reference pixel, calculate a distance on the basis of the pulse signal from the distance measurement pixel, and correct the distance on the basis of the reference distance. This provides an effect that the frame rate and the distance measurement accuracy are improved.

Further, a second aspect of the present technology is an electronic device including: a light emitting unit that radiates radiation light; a photoelectric conversion region that generates charges through photoelectric conversion; a multiplication region that multiplies the generated charges; an output electrode that outputs the multiplied charges; a detection circuit that detects the presence or absence of photons contained in reflected light with respect to the radiation light on the basis of the charges output from the output electrode; an additional electrode that discharges the charges from the photoelectric conversion region in a case where a predetermined potential is applied to the additional electrode; and a control circuit that applies the predetermined potential to the additional electrode at a radiation timing when the radiation light is radiated. This provides an effect that the charges are not output from the output electrode when stray light with respect to the radiation light is incident.

Further, a third aspect of the present technology is a solid-state imaging element including: a pixel array unit in which a plurality of pixels in each of which a photoelectric conversion region that generates charges through photoelectric conversion, a multiplication region that multiplies the generated charges, and an output electrode that outputs the multiplied charges are disposed are arranged; and an additional electrode that is disposed in a region including a boundary between the plurality of pixels and discharges the charges from the photoelectric conversion region. This provides an effect that the miniaturization of the pixel is facilitated.

Further, in this third aspect, the pixel array unit may be divided into a plurality of sharing blocks in each of which a predetermined number of pixels are disposed, and in each of the plurality of sharing blocks, the predetermined number of pixels may share the additional electrode. This provides an effect that the number of the additional electrodes per pixel is reduced.

Further, in this third aspect, four pixels may be disposed in each of the plurality of sharing blocks. This provides an effect that the additional electrode is disposed for every four pixels.

Further, in this third aspect, two pixels may be disposed in each of the plurality of sharing blocks. This provides an effect that the additional electrode is disposed for every two pixels.

Further, in this third aspect, the additional electrode may be disposed for each pixel. This provides an effect that the charge discharging capacity per pixel is improved.

Further, in this third aspect, the additional electrode may be disposed in a region including corners of the pixels in the boundary. This provides an effect that the charges are discharged from the additional electrode disposed at the corners.

Further, in this third aspect, the additional electrode may be disposed in a region not including corners of the pixel and including sides of the pixels in the boundary. This provides an effect that the charges are discharged from the additional electrode disposed at the sides.

Further, in this third aspect, the output electrode and the additional electrode may be cathodes, and each of the plurality of pixels may be further provided with an anode embedded in the boundary. This provides an effect that the man-hours are reduced.

Further, in this third aspect, a predetermined semiconductor region may be disposed between the output electrode and the additional electrode, and the output electrode and the additional electrode may be formed of a semiconductor having a polarity different from that of the semiconductor region. This provides an effect that the man-hours are reduced.

Further, a fourth aspect of the present technology is an electronic device including: a light emitting unit that radiates radiation light; a pixel array unit in which a plurality of pixels in each of which a photoelectric conversion region that generates charges through photoelectric conversion, a multiplication region that multiplies the generated charges, and an output electrode that outputs the multiplied charges are disposed are arranged; and an additional electrode that is disposed in a region including a boundary between the plurality of pixels and discharges the charges from the photoelectric conversion region. This provides an effect that the miniaturization of the pixel in the electronic device is facilitated.

DESCRIPTION OF EMBODIMENTS

Modes for implementing the present technology (hereinafter referred to as embodiments) will be described hereinafter. The description will be made in the following order.

1. First Embodiment (example in which additional cathode is provided and potential is controlled)
2. Second Embodiment (example in which additional cathode is provided at boundary between pixels)
3. Application Example to Moving Body

1. First Embodiment

[Configuration Example of Distance Measurement Module]

Figure 1:
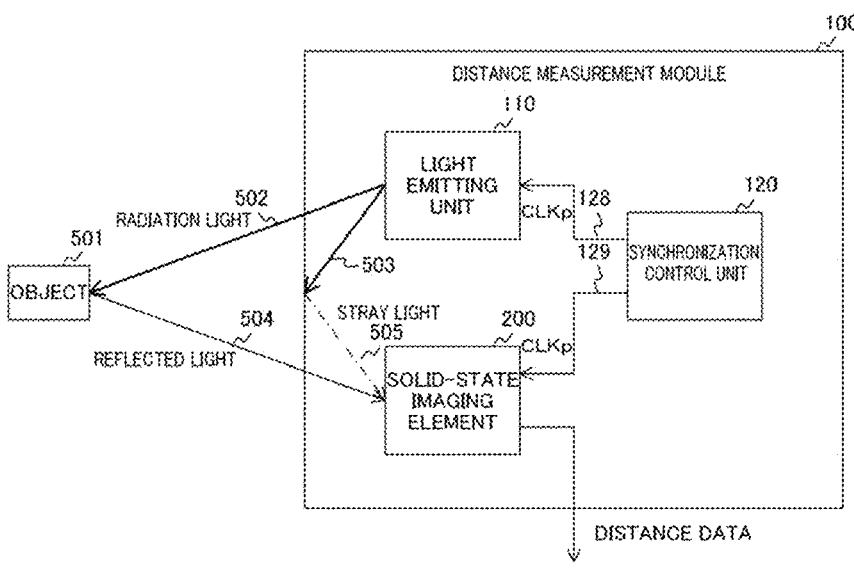
FIG. 1 is a block diagram illustrating a configuration example of a distance measurement module according to a first embodiment of the present technology.

FIG. 1 is a block diagram illustrating a configuration example of a distance measurement module 100 according to a first embodiment of the present technology. The distance measurement module 100 measures a distance to an object and includes a light emitting unit 110, a synchronization control unit 120, and a solid-state imaging element 200. The distance measurement module 100 is mounted on a smartphone, a personal computer, an in-vehicle device, or the like and is used for measuring a distance.

The synchronization control unit 120 operates the light emitting unit 110 and the solid-state imaging element 200 in synchronization with each other. The synchronization control unit 120 supplies a clock signal CLKp having a predetermined frequency (10 to 20 MHz or the like) to the light emitting unit 110 and the solid-state imaging element 200 via signal lines 128 and 129.

The light emitting unit 110 supplies intermittent light as radiation light in synchronization with the clock signal CLKp from the synchronization control unit 120. For example, near-infrared light or the like is used as the radiation light.

The solid-state imaging element 200 receives reflected light with respect to the radiation light and measures a turnaround time from a light emitting timing indicated by the clock signal CLKp to a timing at which the reflected light is received. The solid-state imaging element 200 calculates a distance to the object 501 from the turnaround time, generates distance data indicating the distance, and outputs the distance data.

Here, the radiation light 502 is reflected by the object 501 to be distance-measured and is incident on the solid-state imaging element 200 as the reflected light 504, but the radiation light 502 may be reflected in the distance measurement module 100 and may be incident on the solid-state imaging element 200 as stray light 505. In a case where a cover glass (not shown) is present on a surface of the distance measurement module 100, some of the radiation light 502 is reflected by the cover glass and the stray light 505 is generated as illustrated in the figure. If the solid-state imaging element 200 erroneously detects a light receiving timing of the stray light 505 as a light receiving timing of the reflected light 504, the distance measurement accuracy may decrease. Details of a method for preventing this erroneous detection will be described later.

[Configuration Example of Solid-State Imaging Element]

Figure 2:
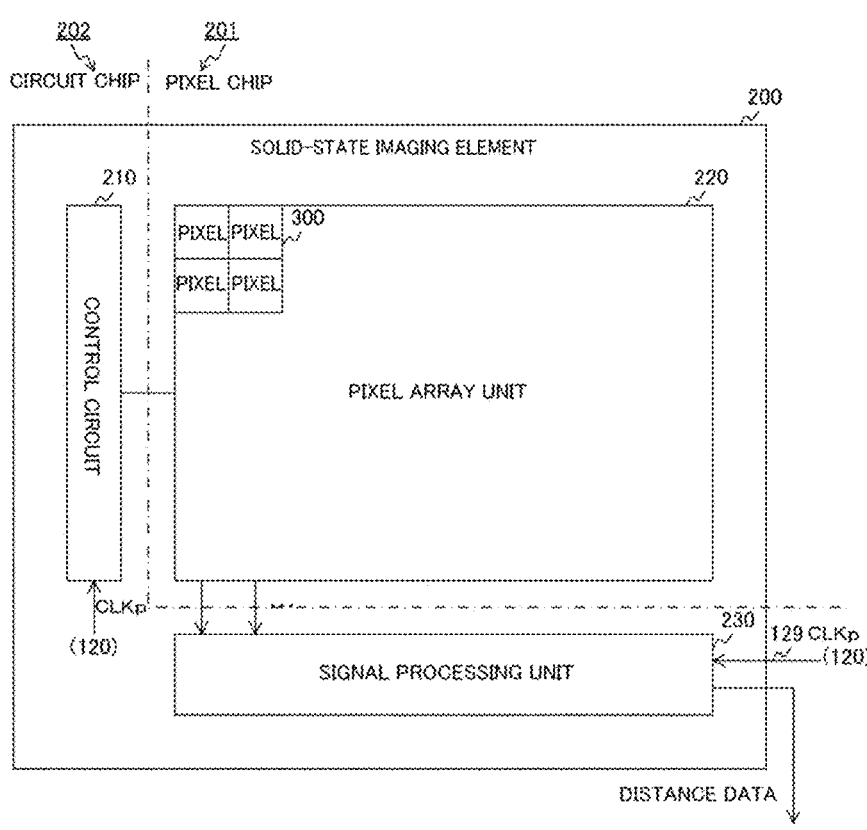
FIG. 2 is a block diagram illustrating a configuration example of a solid-state imaging element according to the first embodiment of the present technology.

FIG. 2 is a block diagram illustrating a configuration example of the solid-state imaging element 200 according to the first embodiment of the present technology. The solid-state imaging element 200 includes a control circuit 210, a pixel array unit 220, and a signal processing unit 230. In the pixel array unit 220, a plurality of pixels 300 are arrayed in a 2-dimensional lattice form.

The control circuit 210 controls each of the pixels 300 in the pixel array unit 220 on the basis of the clock signal CLKp from the synchronization control unit 120. Details of the control content will be described later.

The signal processing unit 230 measures the turnaround time for each pixel circuit on the basis of a signal from the pixels 300 and the clock signal CLKp and calculates the distance. The signal processing unit 230 generates the distance data indicating the distance for each pixel group corresponding to a distance measurement point and outputs the distance data to the outside.

Further, the pixel array unit 220 is disposed on a pixel chip 201, and the control circuit 210 and the signal processing unit 230 are disposed on a circuit chip 202 stacked on the pixel chip 201.

Although the control circuit 210 is disposed on the circuit chip 202, it may be disposed on the pixel chip 201. At that time, a part or all of the control circuit 210 may be distributed and disposed in each of the pixels 300. Further, the control circuit 210 may be distributed and disposed in each of the pixel chip 201 and the circuit chip 202. Further, in a case where the control circuit 210 is disposed on the circuit chip 202, the control circuit 210 may be disposed directly under the pixel array unit 220 with the pixel chip 201 as an upper side. In a case where the control circuit 210 is disposed directly under the pixel array unit 220, the control circuit 210 may be distributed for each pixel, and the distributed individual circuit may be disposed directly under the corresponding pixel. In this case, a signal line up to the pixel 300 to be controlled is wired in a wiring layer of the pixel chip 201 or the circuit chip 202.

[Configuration Example of Pixel]

Figure 3:
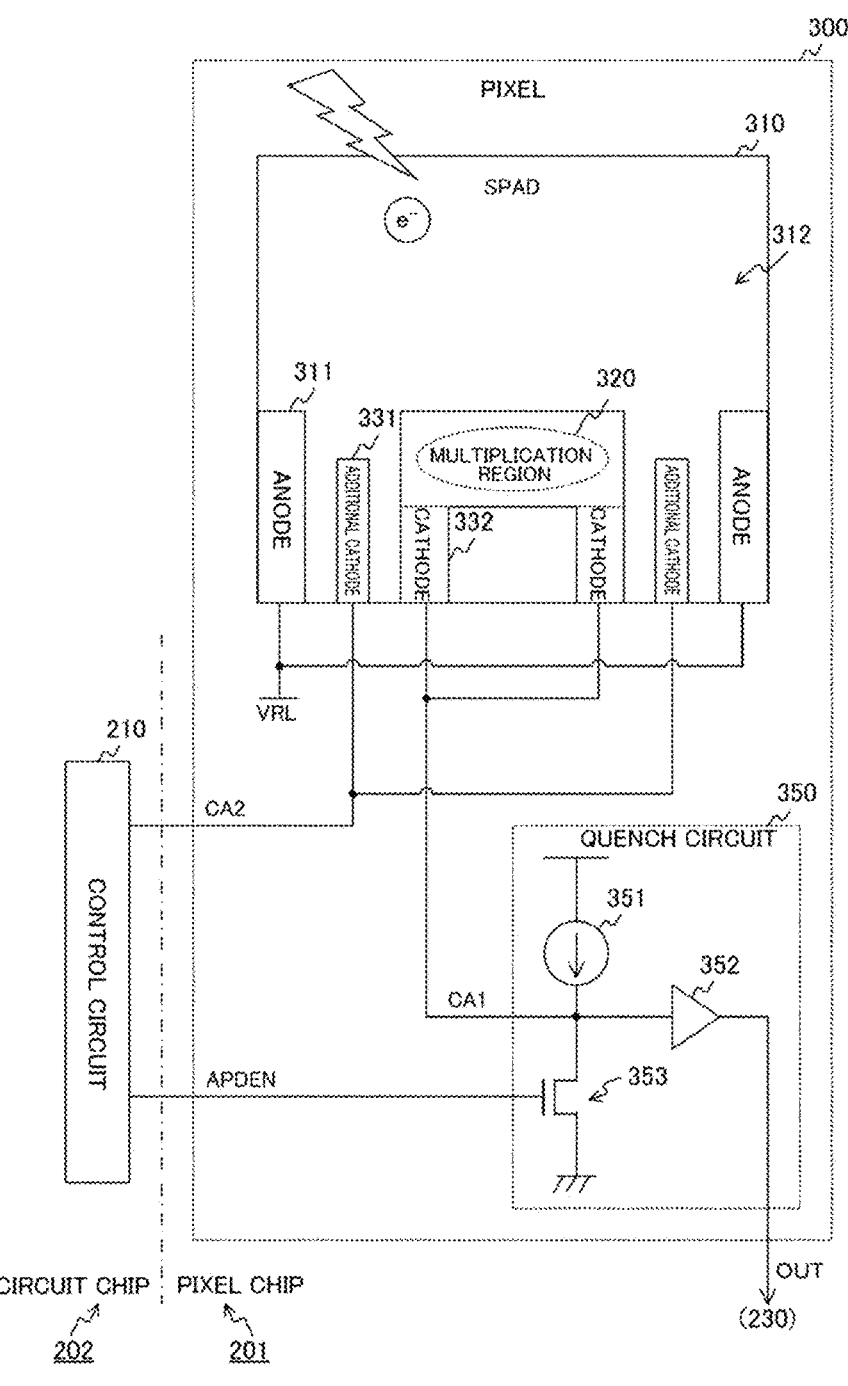
FIG. 3 shows a cross-sectional view and a circuit diagram illustrating a configuration example of a pixel according to the first embodiment of the present technology.

FIG. 3 shows a cross-sectional view and a circuit diagram illustrating a configuration example of the pixel 300 according to the first embodiment of the present technology. The pixel 300 includes an SPAD 310 and a quench circuit 350. Further, the quench circuit 350 includes a current source 351, a buffer 352, and a negative metal-oxide-semiconductor (nMOS) transistor 353.

The SPAD 310 generates charges through photoelectric conversion and multiplies the charges. The SPAD 310 is provided with an anode 311, a photoelectric conversion region 312, a multiplication region 320, an additional cathode 331, and a cathode 332. A low potential VRL lower than a predetermined reference potential VSS is applied to the anode 311.

The photoelectric conversion region 312 is a region that generates charges (for example, electrons) through photoelectric conversion. The multiplication region 320 avalanche-multiplies the charges (electrons or the like) generated in the photoelectric conversion region 312.

The control circuit 210 supplies a signal having a predetermined potential as a control signal CA2 to the additional cathode 331 at a radiation timing of the radiation light. In a case where the low potential VRL is applied to the anode 311, a high level control signal CA2 having a potential (a power source potential or the like) higher than the low potential VRL is supplied to the additional cathode 331. Since a bias voltage is applied between the anode 311 and the additional cathode 331, a current flows between them, and the electrons generated by the photoelectric conversion region 312 are discharged from the additional cathode 331. Further, an ion implantation profile is set such that the current preferentially flows between the anode 311 and the additional cathode 331 and the current does not flow through the multiplication region 320. As a result, the electrons are not output from the cathode 332.

Further, the control circuit 210 supplies a signal having a potential lower than the power source potential (in other words, a low level) as the control signal CA2 to the additional cathode 331 during a period in which the reflected light is incident. In a case where a low level is applied to the additional cathode 331, the voltage between the anode 311 and the additional cathode 331 is lowered, and when the reflected light is incident, the multiplied electrons are output from the cathode 332 to the quench circuit 350.

The additional cathode 331 is provided as an additional electrode, but an additional anode may be provided instead of the additional cathode 331. In this case, a high level is applied to the cathode, the quench circuit 350 is connected to the anode, and low level charges are applied to the additional anode at the radiation timing.

The additional cathode 331 is an example of an additional electrode described in the claims, and the cathode 332 is an example of an output electrode described in the claims.

The quench circuit 350 detects the presence or absence of photons contained in the reflected light on the basis of the charges output from the cathode 332. In this quench circuit 350, the current source 351 and the nMOS transistor 353 are connected in series between a power source node and a reference node. A connection node between them is connected to the cathode 332. The quench circuit 350 is an example of a detection circuit described in the claims.

Further, an enable signal APDEN from the control circuit 210 is input to a gate of the nMOS transistor 353. The enable signal APDEN is a signal for setting a photon detection function of the pixel 300 to be enable or disable. For example, a low level enable signal APDEN is supplied in a case where the photon detection function is set to be enable, and a high level enable signal APDEN is supplied in a case where the photon detection function is set to be disable.

The nMOS transistor 353 transitions to an off state in a case where the enable signal APDEN is a low level (that is, enable) and transitions to an on state in a case where the enable signal APDEN is at a high level (that is, disable). The nMOS transistor 353 is an example of a transistor described in the claims.

The buffer 352 outputs a pulse signal OUT on the basis of a cathode signal CA1 which is a signal of a potential of the connection node between the current source 351 and the nMOS transistor 353. The buffer 352 outputs a high level pulse signal OUT in a case where the cathode signal CA1 is higher than a predetermined threshold value and outputs a low level pulse signal OUT to the signal processing unit 230 in a case where the cathode signal CA1 is equal to or lower than the threshold value. An inverter may be provided instead of the buffer 352. The buffer 352 is an example of a logic gate described in the claims.

According to the configuration illustrated in the figure, when the reflected light is incident in a case where the photon detection function is enable, the potential of the cathode signal CA1 is lowered, and the quench circuit 350 outputs a low level pulse signal OUT when the potential is equal to or lower than the threshold value. Therefore, the low level pulse signal OUT indicates that photons have been incident.

The entire pixel 300 is disposed on the pixel chip 201, but a part of the pixel 300 (for example, the SPAD 310) may be disposed on the pixel chip 201, and the rest may be disposed on the circuit chip 202.

Figures 4A, 4B:
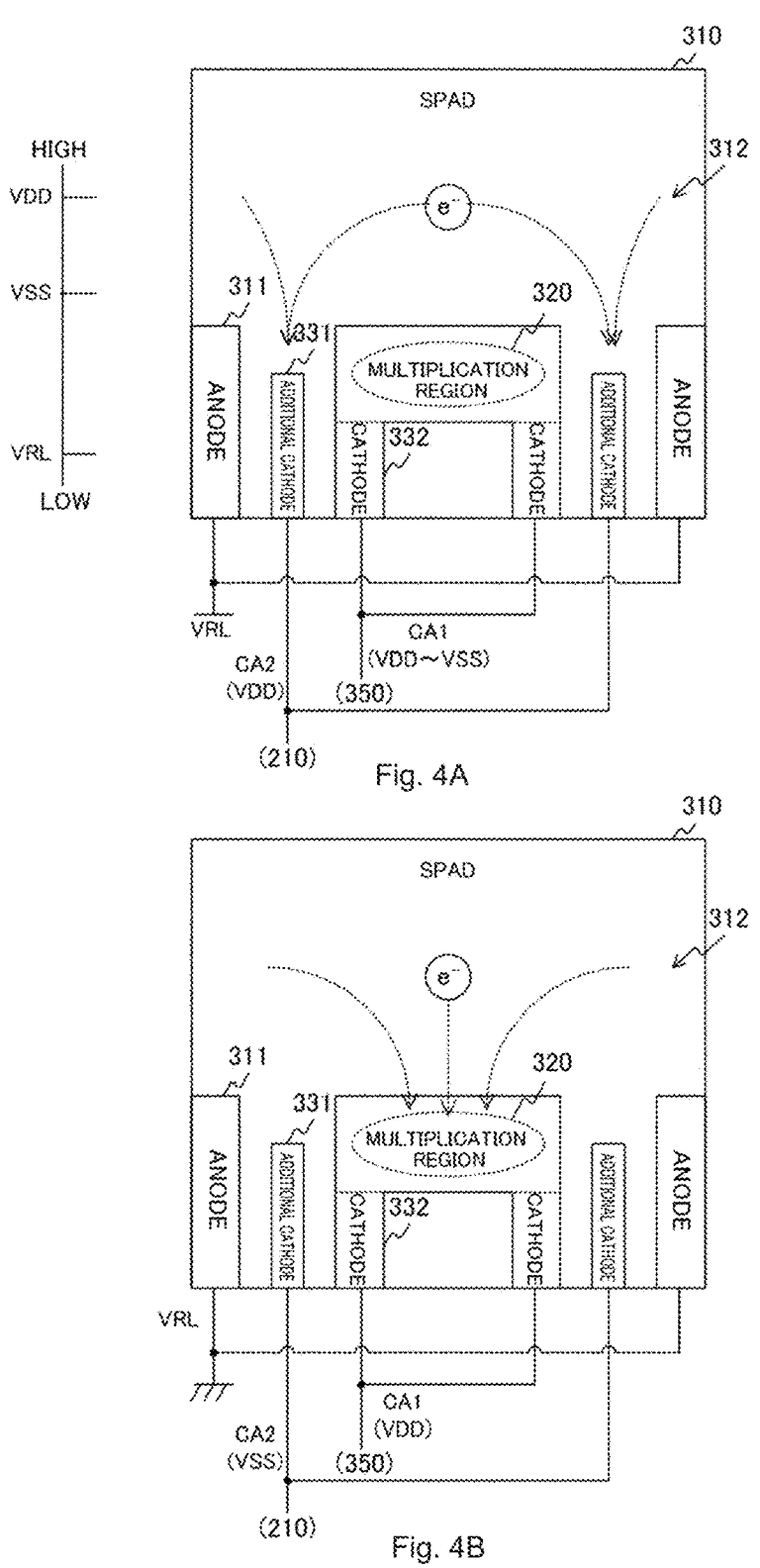
FIGS. 4A and 4B are diagrams illustrating a driving method of the pixel according to the first embodiment of the present technology.

FIGS. 4A and 4B are diagrams illustrating a driving method of the pixel 300 according to the first embodiment of the present technology. FIG. 4A is a cross-sectional view showing the state of the pixel 300 at the radiation timing of the radiation light, and FIG. 4B is a cross-sectional view showing the state of the pixel 300 at an incidence timing of the reflected light.

As illustrated in FIG. 4A, the low potential VRL lower than the reference potential VSS is applied to the anode 311. Further, at the radiation timing, the control circuit 210 supplies the control signal CA2 having the power source potential VDD higher than the reference potential VSS to the additional cathode 331. Since a potential difference between the power source potential VDD and the low potential VRL (that is, the bias voltage) is applied between the anode 311 and the additional cathode 331, the electrons generated by the photoelectric conversion region 312 are discharged from the additional cathode 331 without passing through the multiplication region 320.

However, in a case where the charges are insufficiently discharged, when the stray light is incident, the potential of the cathode signal CA1 from the cathode 332 may be lowered from the power source potential VDD to the reference potential VSS.

Further, as illustrated in FIG. 4B, the control circuit 210 supplies the control signal CA2 having the reference potential VSS to the additional cathode 331 during a period in which the reflected light is incident. Through this potential control, the voltage between the anode 311 and the additional cathode 331 is lowered, and when the reflected light is incident, the photoelectrically converted electrons are supplied to the multiplication region 320 to be multiplied. Then, the multiplied electrons are output from the cathode 332 to the quench circuit 350, and the photons are detected with the potential of the cathode signal CA1 lowered.

[Configuration Example of Signal Processing Unit]

Figure 5:
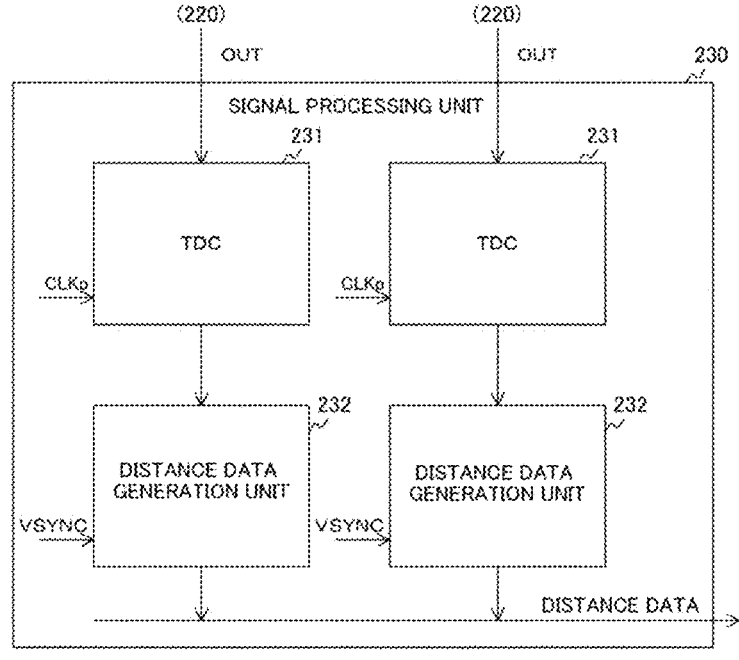
FIG. 5 is a block diagram illustrating a configuration example of a signal processing unit according to the first embodiment of the present technology.

FIG. 5 is a block diagram illustrating a configuration example of the signal processing unit 230 according to the first embodiment of the present technology. The signal processing unit 230 includes a time-to-digital converter (TDC) 231 and a distance data generation unit 232 for each column.

The TDC 231 measures the time from the light emitting timing indicated by the clock signal CLKp to the falling (that is, the light receiving timing) of the pulse signal OUT from the corresponding column. The TDC 231 supplies a digital signal indicating the measured time to the distance data generation unit 232.

The distance data generation unit 232 calculates the distance D to the object. The distance data generation unit 232 sets a mode among the times measured by the TDC 231 for each cycle of a vertical synchronization signal VSYNC having a frequency lower than the clock signal CLKp (30 Hz or the like) within the cycle as the turnaround time dt. Then, the distance data generation unit 232 calculates the distance D using the following equation and outputs the distance data indicating the distance D.

$$D=c \times dt/2 \qquad \text{Equation 1}$$

In the above equation, c is the speed of light and the unit thereof is meters per second (m/s). The unit of the distance D is, for example, meters (m), and the unit of the turnaround time dt is, for example, seconds (s).

Figures 6A, 6B, 6C, 6D:
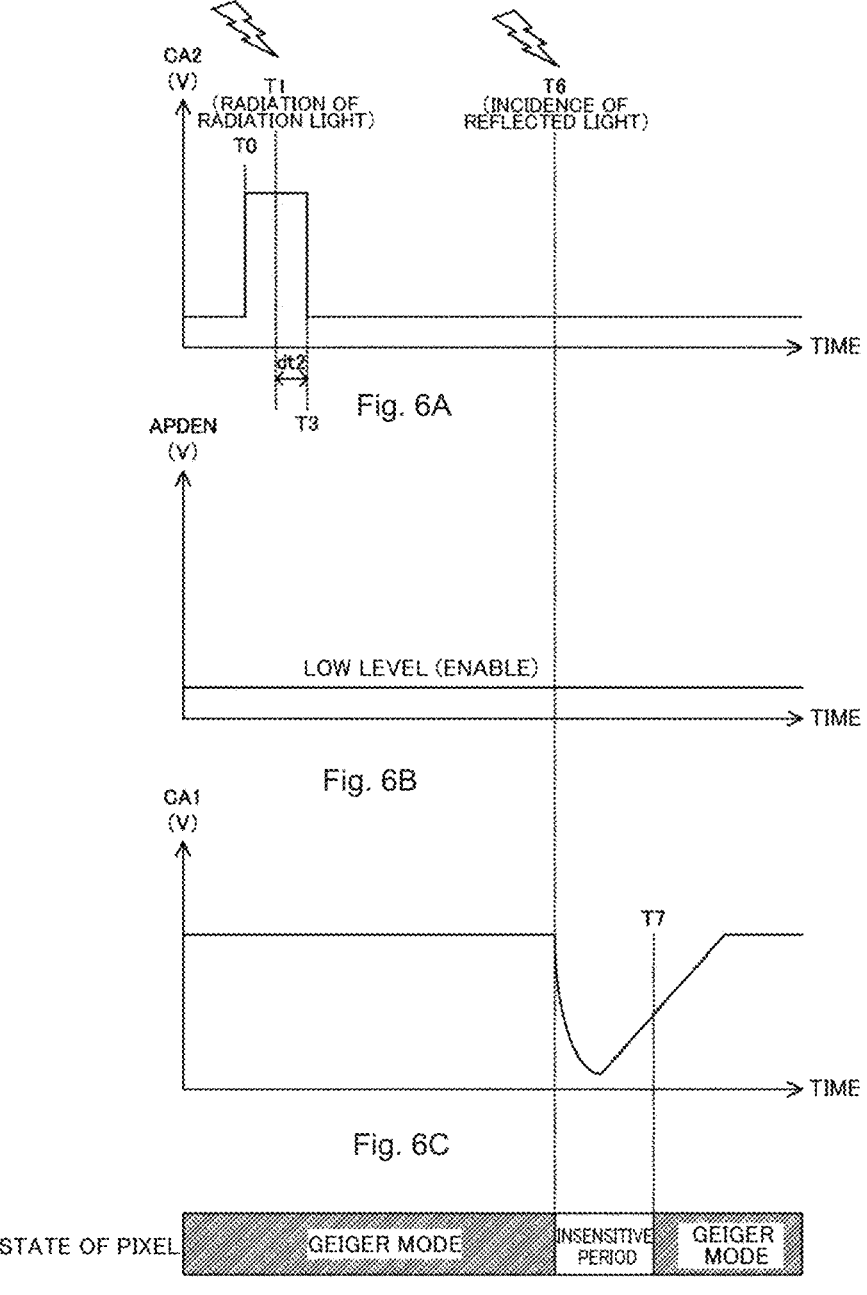
FIGS. 6A, 6B, 6C, and 6D are timing charts illustrating an example of an operation of a control circuit according to the first embodiment of the present technology.

FIGS. 6A, 6B, 6C, and 6D are timing charts illustrating an example of an operation of the control circuit 210 according to the first embodiment of the present technology. FIG. 6A is a timing chart illustrating an example of fluctuation of the control signal CA2. FIG. 6B is a timing chart illustrating an example of fluctuation of the enable signal APDEN. FIG. 6C is a timing chart illustrating an example of fluctuation of the cathode signal CA1. FIG. 6D is a timing chart illustrating an example of the state of the pixel 300. The radiation light is radiated at a timing T1 and the reflected light with respect to the radiation light is incident on the pixel 300 at a timing T6.

As illustrated in FIG. 6A, the control circuit 210 controls the control signal CA2 to be at a high level over a period from a timing T0 immediately before the timing T1 to a timing T3 immediately after the timing T1. Other than this period, the control signal CA2 is controlled to be at a low level.

Further, as illustrated in FIG. 6B, the control circuit 210 supplies the enable signal APDEN at a low level (that is, enable).

Further, as illustrated in FIG. 6C, at the timing T6, the photons of the reflected light are multiplied and the potential of the cathode signal CA1 drops. This potential is restored with the current from the current source 351 and becomes higher than the threshold value in the buffer 352 at a timing T7.

Further, as illustrated in FIG. 6D, the pixel 300 operates in a Geiger mode in which the distance can be measured during a period until the timing T6. During a period from the timing T6 to the timing T7, the potential of the cathode signal CA1 has not been restored, and thus the presence or absence of the photons cannot be detected even if the photons are newly received and photoelectrically converted. As a result, the period from the timing T6 to the timing T7 becomes an insensitive period. After the timing T7, the potential is restored, and thus the pixel 300 operates again in the Geiger mode.

Figures 7A, 7B, 7C, 7D:
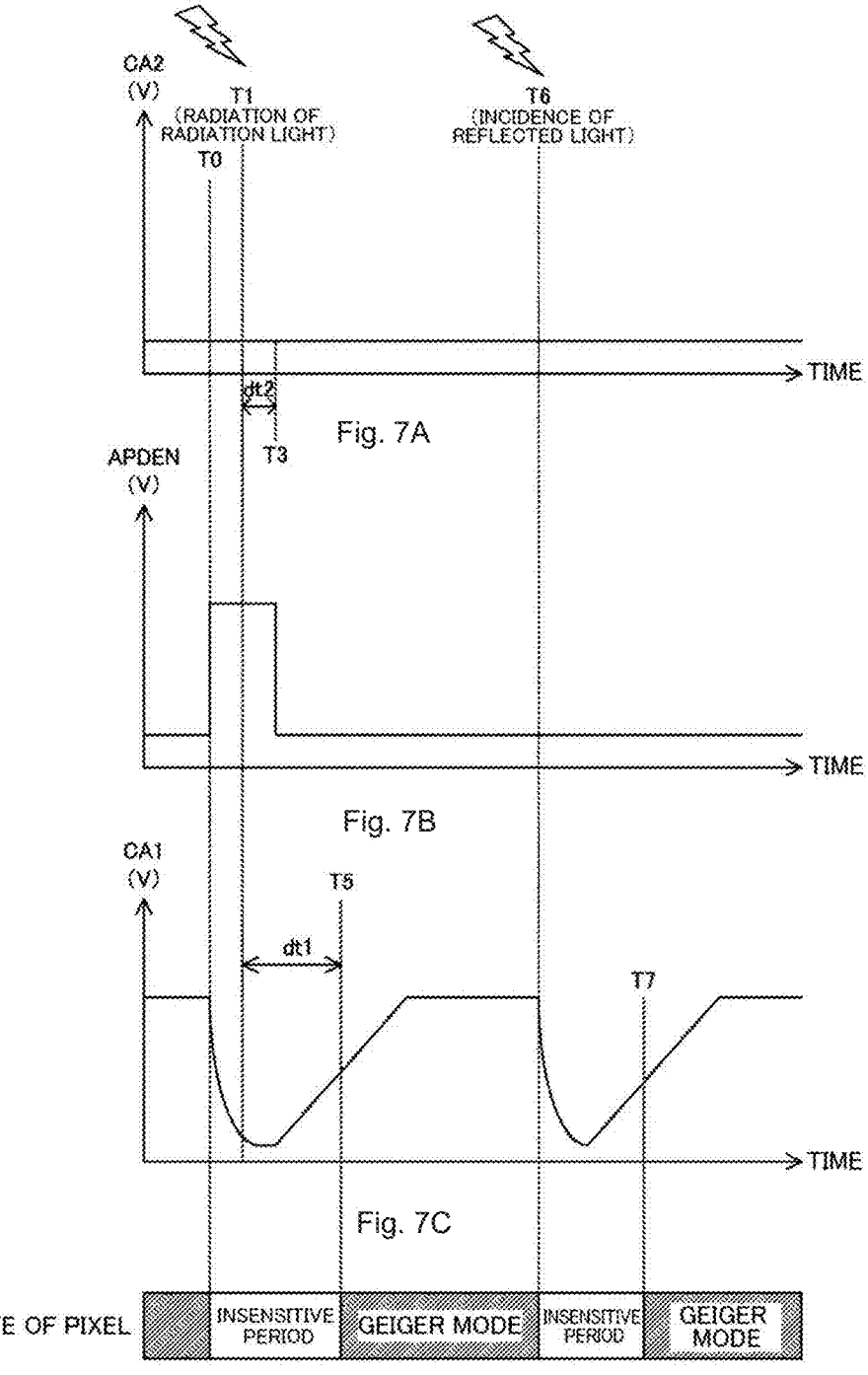
FIGS. 7A, 7B, 7C, and 7D are timing charts illustrating an example of an operation of a control circuit according to a comparative example.

Here, a comparative example in which a high level is not applied to the additional cathode 331 is assumed. FIGS. 7A, 7B, 7C, and 7D are timing charts illustrating an example of an operation of a control circuit according to the comparative example. In the comparative example, as illustrated in FIG. 7A, the control signal CA2 is not controlled to be at a high level and remains at a low level within the period from the timing T0 to the timing T3. Further, in the comparative example, in order to prevent the erroneous detection of the stray light, the control circuit 210 supplies the enable signal APDEN at a high level (disable) within the period from the timing T0 to the timing T3 as illustrated in FIG. 7B.

The nMOS transistor 353 of the comparative example is in an on state with the enable signal APDEN within the period from the timing T0 to the timing T3. With this control, the potential of the cathode signal CA1 drops as illustrated in FIG. 7C and becomes equal to or lower than the threshold value in the buffer 352. Then, the potential of the cathode signal CA1 is restored and becomes higher than the threshold value in the buffer 352 at a timing T5.

As illustrated in FIG. 7C, in the comparative example, the potential drops within a period from the timing T0 to the timing T5, and thus this period becomes an insensitive period. Therefore, the time when the distance can be measured by detecting the photons of the reflected light is after the timing T5. Therefore, the shortest distance that can be measured is a distance corresponding to a turnaround time dt1 from the timing T1 to the timing T5.

On the other hand, in a case where the control circuit 210 controls the control signal CA2 to be at a high level at the radiation timing, the electrons are discharged from the additional cathode 331 without passing through the multiplication region 320 as described above. As a result, the electrons are not output from the cathode 332, and the potential of the cathode signal CA1 does not drop as illustrated in e in FIG. 6C. Therefore, the shortest distance that can be measured is a distance corresponding to a turnaround time dt2 from the timing T1 to the timing T3. This turnaround time dt2 is shorter than the turnaround time dt1 of the comparative example. Therefore, from Equation 1, it is possible to shorten the shortest distance that can be measured as compared with the comparative example.

[Operation Example of Distance Measurement Module]

Figure 8:
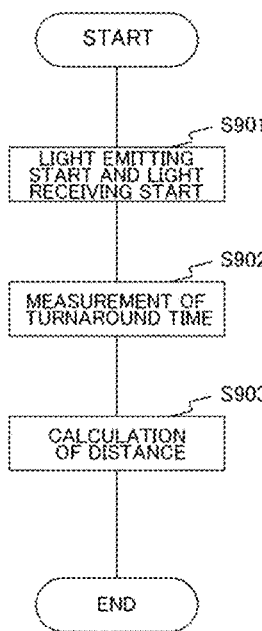
FIG. 8 is a flowchart illustrating an example of an operation of the distance measurement module according to the first embodiment of the present technology.

FIG. 8 is a flowchart illustrating an example of an operation of the distance measurement module 100 according to the first embodiment of the present technology. This operation starts when a predetermined application for performing distance measurement is executed.

The distance measurement module 100 starts emitting the radiation light and receiving the reflected light. At this time, the potential of the additional cathode 331 is controlled in synchronization with the radiation timing (step S901). Further, the distance measurement module 100 measures the turnaround time (step S902) and calculates the distance to the object (step S903). After step S903, the distance measurement module 100 ends the operation for distance measurement.

As described above, in the first embodiment of the present technology, the control circuit 210 supplies the high level control signal CA2 to the additional cathode 331 at the radiation timing to discharge the charges, and thus the charges are not output from the cathode 311 to the quench circuit 350. Therefore, it is not necessary to set the quench circuit 350 to be disable in order to prevent the erroneous detection of the stray light. As a result, the distance can be measured from the time when the control signal CA2 is restored to be at a low level, and it is possible to shorten the shortest distance that can be measured as compared with the case where the quench circuit 350 is set to be disable.

FIRST MODIFICATION EXAMPLE

In the first embodiment described above, the control circuit 210 prevents the electrons from flowing into the multiplication region 320 by supplying the high level control signal CA2 to the additional cathode 331 at the radiation timing. However, the electrons may flow into the multiplication region 320 within this high level period. The control circuit 210 of the first modification example in the first embodiment is different from that of the first embodiment in that an amplification factor in the multiplication region 320 is significantly reduced by setting such that the enable signal APDEN at a high level (disable) is supplied within the period in which the control signal CA2 is at a high level.

Figures 9A, 9B, 9C, 9D:
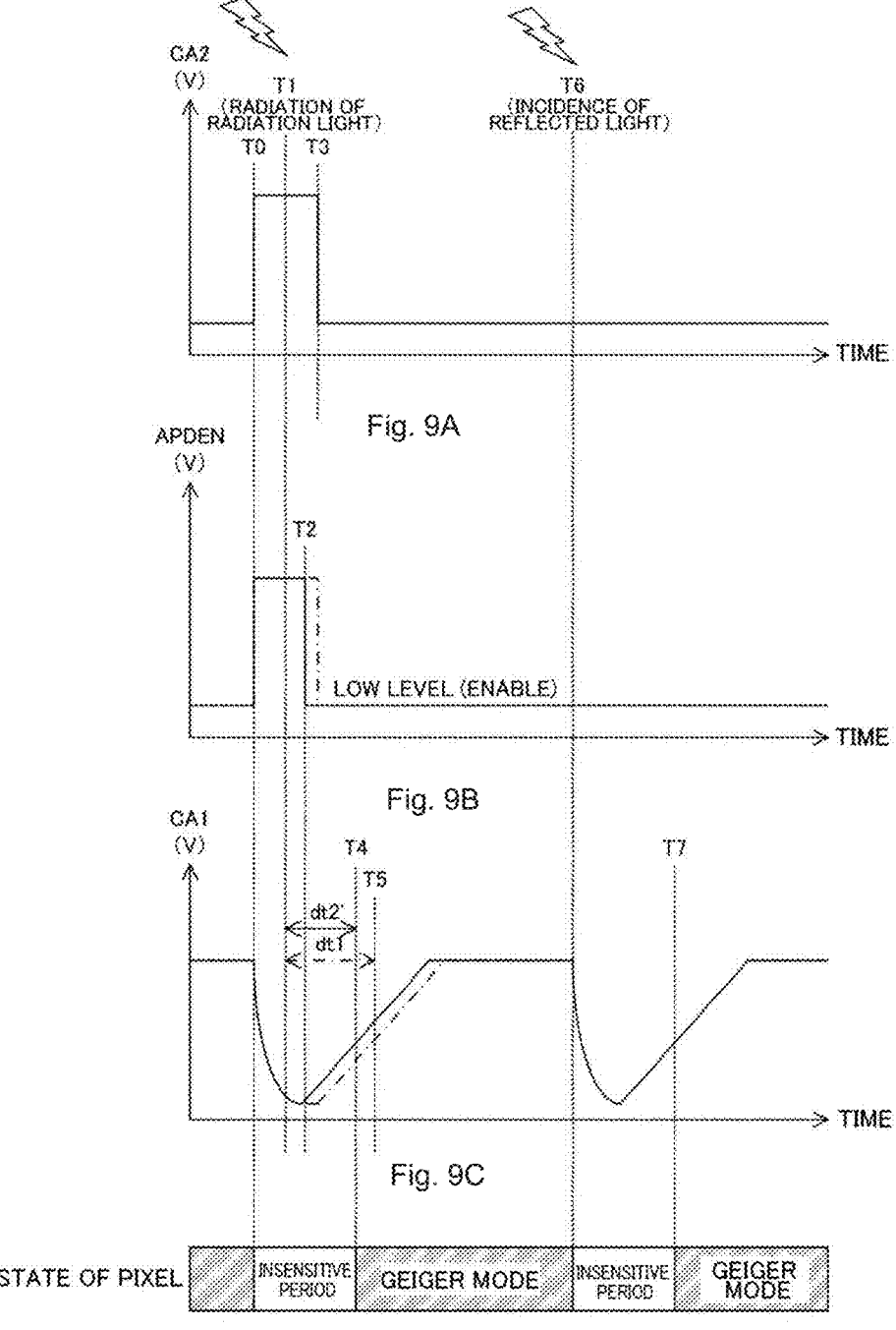
FIGS. 9A, 9B, 9C, and 9D are timing charts illustrating an example of an operation of a control circuit according to a first modification example of the first embodiment of the present technology.

FIGS. 9A, 9B, 90, and 9D timing charts illustrating an example of an operation of a control circuit 210 according to the first modification example of the first embodiment of the present technology. FIG. 9A is a timing chart illustrating an example of fluctuation of the control signal CA2. FIG. 9B is a timing chart illustrating an example of fluctuation of the enable signal APDEN. FIG. 9C is a timing chart illustrating an example of fluctuation of the cathode signal CA1. FIG. 9D is a timing chart illustrating an example of the state of the pixel 300.

As illustrated in FIG. 9A, the control circuit 210 controls the control signal CA2 to be at a high level over the period from the timing TO to the timing T3. Other than this period, the control signal CA2 is controlled to be at a low level.

Further, as illustrated in FIG. 9B, the control circuit 210 controls the enable signal APDEN to be at a high level (disable) over a period from the timing TO to a timing T2 immediately before the timing T3. Other than this period, the enable signal APDEN is controlled to be at a low level.

Further, as illustrated in FIG. 9C, with the control for the enable signal APDEN, the potential of the cathode signal CA1 drops and becomes equal to or lower than the threshold value in the buffer 352. Then, the potential of the cathode signal CA1 is restored and becomes higher than the threshold value in the buffer 352 at a timing T4.

Further, as illustrated in FIG. 9D, the pixel 300 operates in a Geiger mode during a period until the timing T0. A period from the timing T0 to the timing T4 is an insensitive period. At the timing T4, the pixel 300 operates again in the Geiger mode. The operations after the timing T6 are the same as those in the first embodiment.

Here, as in the first embodiment, a comparative example in which the control circuit 210 does not apply a high level to the additional cathode 331 and supplies a high level enable signal APDEN within the period from the timing TO to the timing T3 is assumed. An alternate long and short dash line in FIG. 9B shows the potential fluctuation of the enable signal APDEN of the comparative example.

In the comparative example in which the photon detection function is enable at the timing T3, the potential of the cathode signal CA1 is restored at the timing T5. On the other hand, in the first modification example, the photon detection function is enable at the timing T2 before the timing T3, and thus the potential can be restored at the timing T4 earlier than the comparative example. As a result, it is possible to shorten the shortest distance as compared with the comparative example.

Further, by setting the photon detection function to be disable within the period for supplying the high level to the additional cathode 331, it is possible to reliably prevent the electron multiplication in the multiplication region 320 within that period. As a result, it is possible to stabilize the operation of the distance measurement module 100.

Figure 10:
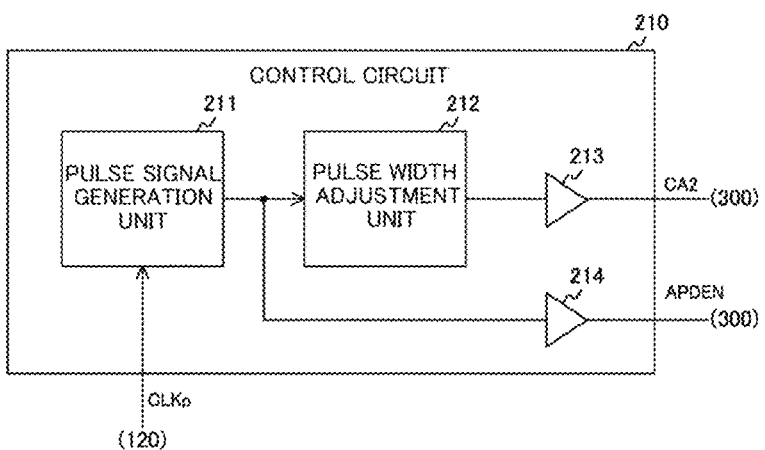
FIG. 10 is a block diagram illustrating a configuration example of the control circuit according to the first modification example of the first embodiment of the present technology.

FIG. 10 is a block diagram illustrating a configuration example of the control circuit 210 according to the first modification example of the first embodiment of the present technology. The control circuit 210 includes a pulse signal generation unit 211, a pulse width adjustment unit 212, a driver 213, and a driver 214. The pulse signal generation unit 211, the pulse width adjustment unit 212, the driver 213, and the driver 214 are provided for each row, for each column, or for each group of one or more pixels in the pixel array unit 220.

The pulse signal generation unit 211 generates the pulse signal in synchronization with the clock signal CLKp from the synchronization control unit 120. The pulse signal generation unit 211 includes, for example, a delay circuit and a level shifter and generates the pulse signal by delaying the clock signal CLKp or adjusting the level thereof. The pulse signal is supplied to the pulse width adjustment unit 212 and the driver 214.

The pulse width adjustment unit 212 lengthens the pulse width of the pulse signal. The pulse width adjustment unit 212 supplies the adjusted pulse signal to the driver 213.

The driver 213 outputs the pulse signal from the pulse width adjustment unit 212 to the pixel 300 as the control signal CA2. The driver 214 outputs the pulse signal from the pulse signal generation unit 211 to the pixel 300 as the enable signal APDEN.

The pulse width adjustment unit 212 adjusts the pulse width of the control signal CA2, but pulse width adjustment unit 212 may adjust the pulse width of the enable signal APDEN.

As described above, in the first modification example of the first embodiment of the present technology, the control circuit 210 sets the quench circuit 350 to be disable within the period of supplying the high level to the additional cathode 331. As a result, it is possible to reliably prevent the electron multiplication in the multiplication region 320 within that period.

SECOND MODIFICATION EXAMPLE

In the first embodiment described above, the synchronization control unit 120 supplies the clock signal CLKp to cause the light emitting unit 110 to emit light, but there is a slight delay time from the rising and falling of the clock signal CLKp to the actual light emission. This delay time may reduce the distance measurement accuracy. A solid-state imaging element 200 of a second modification example of the first embodiment is different from that of the first embodiment in that a reference distance is measured to improve the distance measurement accuracy.

Figures 11A, 11B:
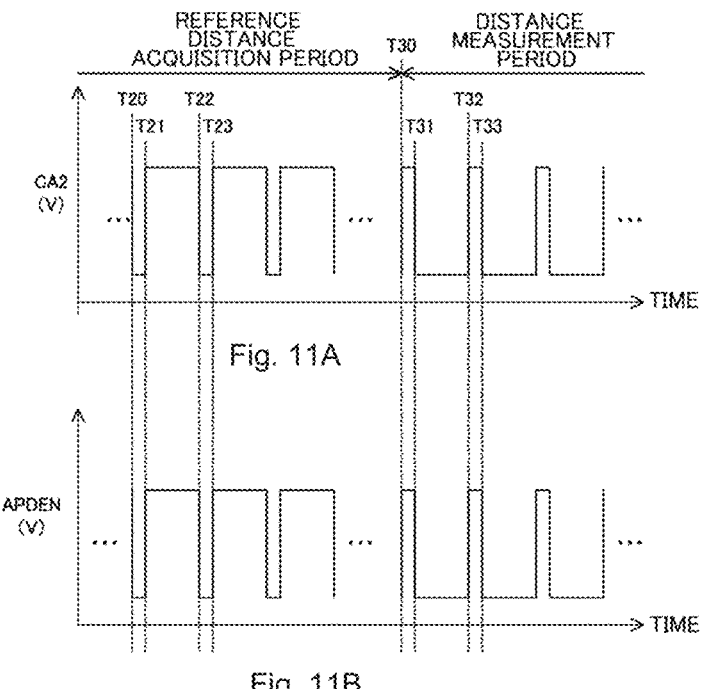
FIGS. 11A and 11B are timing charts illustrating an example of an operation of a control circuit according to a second modification example of the first embodiment of the present technology.

FIGS. 11A and 11B are timing charts illustrating an example of an operation of a control circuit 210 according to the second modification example of the first embodiment of the present technology. FIG. 11A is a timing chart illustrating an example of fluctuation of the control signal CA2. FIG. 11B is a timing chart illustrating an example of fluctuation of the enable signal APDEN.

As illustrated in FIGS. 11A and 11B, within a reference distance acquisition period up to a timing T30, the control circuit 210 alternately sets the control signal CA2 to be at a high level and a low level in synchronization with the clock signal CLKp. Further, the control circuit 210 supplies a signal having the same phase as the control signal CA2 as the enable signal APDEN.

For example, in a case where the light emitting unit 110 emits light at the rising of the clock signal CLKp, the control signal CA2 is controlled to be at a low level over a period from a timing T20 immediately before the rising to a timing T21 immediately after the rising. The control signal CA2 is controlled to be at a low level over a period from a timing T22 immediately before the next rising to a timing T23 immediately after the next rising. During a period between them, the control signal CA2 is controlled to be at a high level.

Similarly, the enable signal APDEN is controlled to be at a low level over the period from T20 to T21. The enable signal APDEN is controlled to be at a low level over the period from the timing T22 to the timing T23. During a period between them, the enable signal APDEN is controlled to be at a high level.

Within the reference distance acquisition period, the signal processing unit 230 measures the turnaround time from the rising of the clock signal CLKp to the light receiving timing of the stray light immediately after that on the basis of the pulse signal. Then, the signal processing unit 230 calculates a distance from the measured turnaround time by Equation 1 and acquires the distance as the reference distance to hold it. In a case where there is a delay time from the rising of the clock signal CLKp to the light emission, the reference distance does not become zero but becomes a larger value than that.

Within the distance measurement period after the timing T30, the control circuit 210 supplies a signal having the same waveform as the enable signal APDEN within the reference distance acquisition period as the control signal CA2 and supplies a signal obtained by inverting the control signal CA2 as the enable signal APDEN.

For example, the control signal CA2 is controlled to be at a high level over a period from a timing T30 immediately before the rising of the clock signal CLKp to a timing T31 immediately after the rising. The control signal CA2 is controlled to be at a high level over a period from a timing T32 immediately before the next rising to a timing T33 immediately after the next rising. During a period between them, the control signal CA2 is controlled to be at a low level.

Similarly, the enable signal APDEN is controlled to be at a high level over the period from T30 to T31. The enable signal APDEN is controlled to be at a high level over the period from the timing T32 to the timing T33. During a period between them, the enable signal APDEN is controlled to be at a low level.

In this distance measurement period, the signal processing unit 230 measures the distance on the basis of the pulse signal and corrects it with the reference distance. For example, the signal processing unit 230 calculates the distance by Equation 1, performs correction processing by subtracting the reference distance from the calculated value, and outputs the corrected distance. As a result, it is possible to improve the distance measurement accuracy. As described above, in the second modification example of the first embodiment, all the pixels are used for both the acquisition of the reference distance and the distance measurement.

As described above, according to the second modification example of the first embodiment of the present technology, the distance is corrected on the basis of the reference distance, and thus the distance measurement accuracy can be improved.

THIRD MODIFICATION EXAMPLE

In the second modification example of the first embodiment described above, the reference distance is acquired within the reference distance acquisition period, and the distance measurement is performed within the distance measurement period after that. However, in this configuration, the acquisition of the reference distance and the distance measurement are performed in a time division manner, the frame rate may decrease when a frame in which the distance data for each pixel are arranged is continuously generated. A solid-state imaging element 200 of a third modification example of the first embodiment is different from that of the second modification example of the first embodiment in that the acquisition of the reference distance and the distance measurement are performed at the same time.

Figure 12:
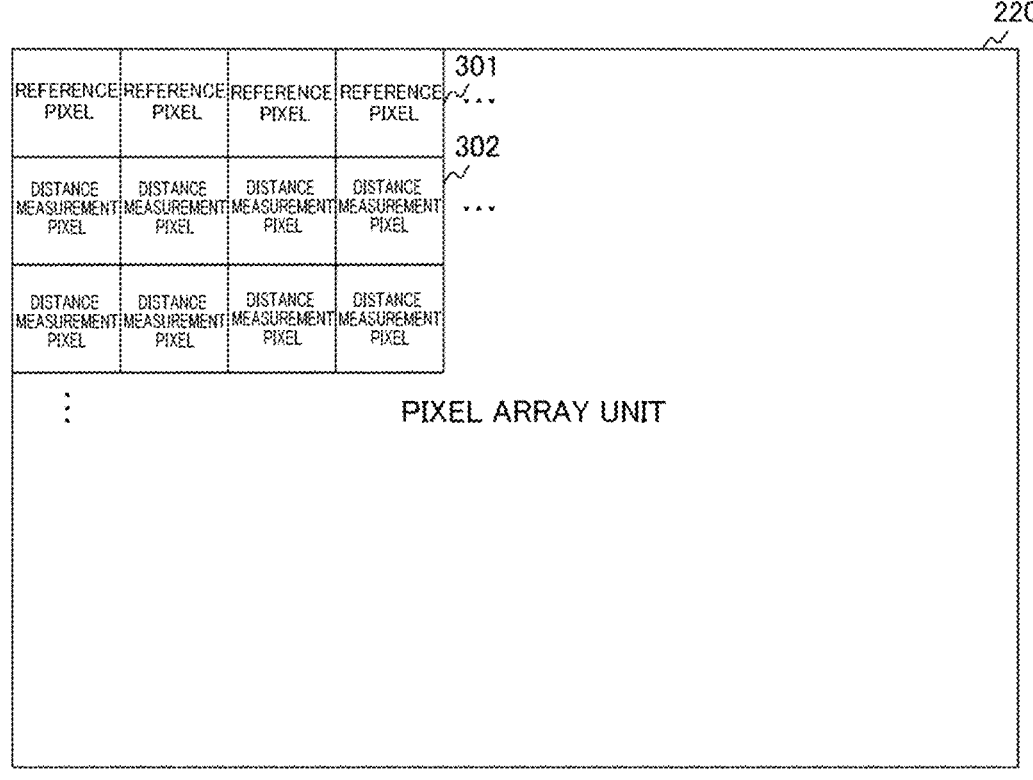
FIG. 12 is a plan view illustrating a configuration example of a pixel array unit according to a third modification example of the first embodiment of the present technology.

FIG. 12 is a plan view illustrating a configuration example of a pixel array unit 220 according to the third modification example of the first embodiment of the present technology. A plurality of reference pixels 301 and a plurality of distance measurement pixels 302 are arranged in the pixel array unit 220 in the third modification example of the first embodiment. The number of pixels of the reference pixels 301 is smaller than that of the distance measurement pixels 302. For example, the reference pixels 301 are arranged in only one row, and the distance measurement pixels 302 are arranged in a plurality of rows. In yet another example, the reference pixels and the distance measurement pixels are each disposed in a plurality of pixel regions of the pixel array unit 220.

The circuit configuration of each of the reference pixels 301 and the distance measurement pixels 302 is the same as that of the pixel 300 of the first embodiment. However, the pulse signal from the reference pixel 301 is used to acquire the reference distance, and the pulse signal from the distance measurement pixel 302 is used to measure the distance.

Figures 13A, 13B, 13C, 13D:
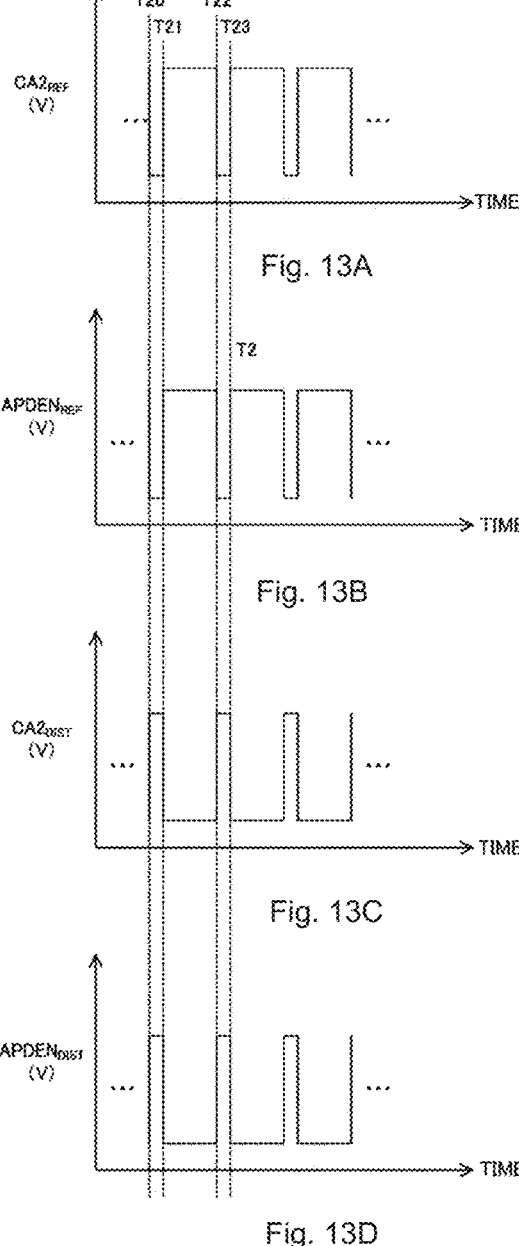
FIGS. 13A, 13B, 13C, and 13D are timing charts illustrating an example of an operation of a control circuit according to the third modification example of the first embodiment of the present technology.

FIGS. 13A, 13B, 13C, and 13D are timing charts illustrating an example of an operation of a control circuit 210 according to the third modification example of the first embodiment of the present technology. FIG. 13A is a timing chart illustrating an example of fluctuation of a control signal CA2REF to the reference pixel 301. FIG. 13B is a timing chart illustrating an example of fluctuation of an enable signal APDENREF to the reference pixel 301. Further, FIG. 13C is a timing chart illustrating an example of fluctuation of a control signal CA2DIST to the distance measurement pixel 302. FIG. 13D is a timing chart illustrating an example of fluctuation of an enable signal APDENDIST to the distance measurement pixel 302.

As illustrated in FIGS. 13A and 13B, the control circuit 210 alternately sets the control signal CA2REF to be at a high level and a low level in synchronization with the clock signal CLKp and supplies a signal having the same phase as the control signal CA2REF as the enable signal APDEN-REF.

For example, the control signal $CA2_{REF}$ is controlled to be at a low level over a period from a timing T20 immediately before the rising of the clock signal CLKp to a timing T21 immediately after the rising. The control signal $CA2_{REF}$ is controlled to be at a low level over a period from a timing T22 immediately before the next rising to a timing T23 immediately after the next rising. During a period between them, the control signal $CA2_{REF}$ is controlled to be at a high level.

Similarly, the enable signal $APDEN_{REF}$ is controlled to be at a low level over the period from T20 to T21. The enable signal $APDEN_{REF}$ is controlled to be at a low level over the period from the timing T22 to the timing T23. During a period between them, the enable signal APDEN is controlled to be at a high level.

Further, the control circuit 210 supplies a signal obtained by inverting the control signal $CA2_{REF}$ to the distance measurement pixel 302 as the control signal $CA2_{DIST}$ and supplies a signal having the same phase as the inverted signal to the distance measurement pixel 302 as the enable signal $APDEN_{DIST}$.

The signal processing unit 230 acquires the reference distance from the pulse signal of the reference pixel 301, obtains the distance from the pulse signal of the distance measurement pixel 302, and corrects the distance with the reference distance. As illustrated in the figure, the signal processing unit 230 can perform the acquisition of the reference distance and the distance measurement at the same time, and thus the frame rate can be improved.

As described above, in the third modification example of the first embodiment of the present technology, the reference pixel 301 and the distance measurement pixel 302 are disposed, and thus the signal processing unit 230 can perform the acquisition of the reference distance and the distance measurement at the same time.

2. Second Embodiment

In the first embodiment described above, the additional cathode 331 is disposed inside the pixel 300, but in this configuration, the addition of the additional cathode 331 for each pixel may make it difficult to miniaturize the pixel. A solid-state imaging element 200 of a second embodiment is different from that of the first embodiment in that the additional cathode 331 is disposed at the boundary between adjacent pixels.

Figure 14:
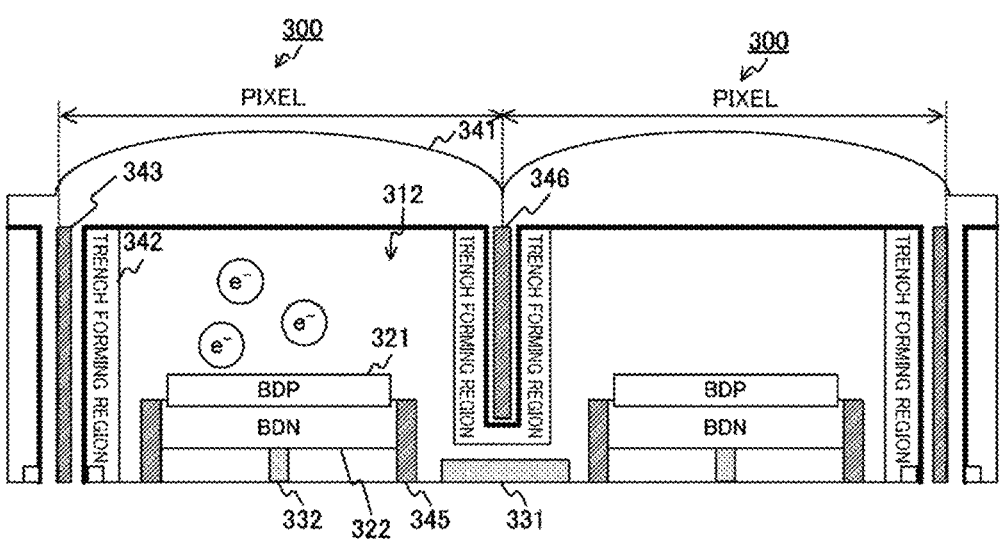
FIG. 14 is a cross-sectional view illustrating a configuration example of a pixel according to a second embodiment of the present technology.
Figure 14:
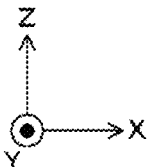

FIG. 14 is a cross-sectional view illustrating a configuration example of a pixel 300 according to the second embodiment of the present technology. The figure shows a cross-sectional view of two adjacent pixels 300. Hereinafter, an axis parallel to an optical axis is referred to as a "Z axis", and an axis perpendicular to the Z axis is referred to as an "X axis". An axis perpendicular to both the Z axis and the X axis will be called a "Y axis".

A microlens 341 is provided in an upper portion of the pixel 300. Further, a photoelectric conversion region 312, a break down positive (BDP) region 321, a break down negative (BDN) region 322, and a cathode 332 are disposed in the pixel 300. The BDP region 321 and the BDN region 322 function as a multiplication region 320, the BDP region 321 contains a P-type impurity, and the BDN region 322 contains an N-type impurity. Further, the additional cathode 331 is formed in a predetermined region including the boundary between two adjacent pixels 300.

Further, when viewed in a Z-axis direction, a trench forming region 342 is disposed around the photoelectric conversion region 312. The trench forming region 242 is constituted by a P-type impurity region, a metal, and a passivation film. Further, in the trench forming region 342, a deep trench isolation (DTI) is formed above the additional cathode 331, and the metal 346 is embedded in the DTI to prevent color mixing. Further, in the trench forming region 342, a trench deeper than a portion above the additional cathode 331 is formed in a region other than the portion above the additional cathode 331, and the metal 343 is embedded. An anode (not shown) is connected to the metal 343.

Further, a short trench isolation (STI) 345 is formed between the cathode 332 and the additional cathode 331.

As illustrated in the figure, by disposing the additional cathode 331 in the region including the boundary between the pixels, it is not necessary to provide a space for the additional cathode 331 in the pixel, and it is easy to miniaturize the pixel.

Figure 15:
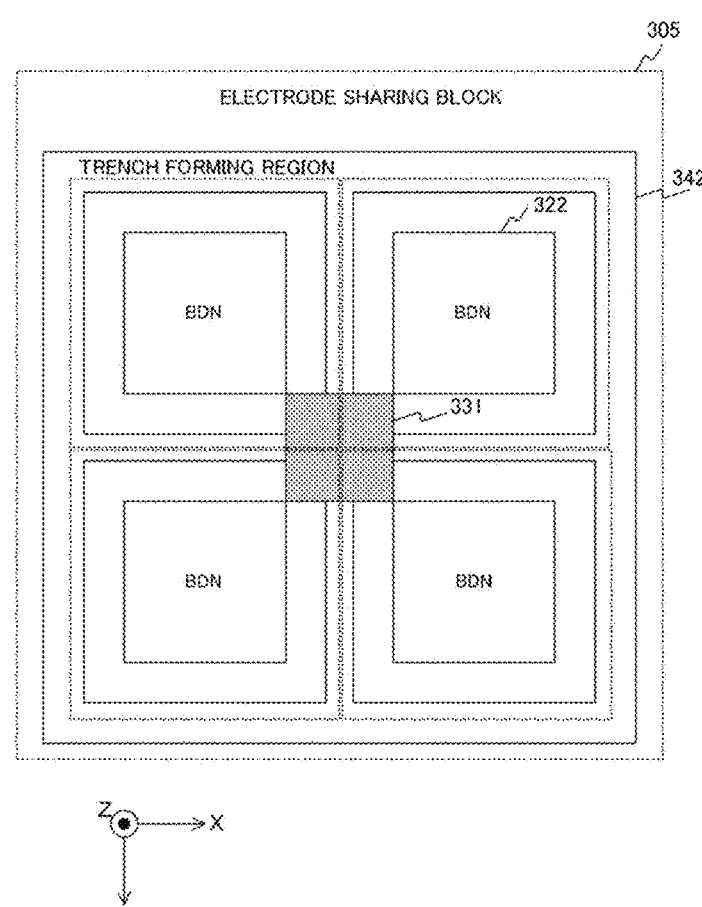
FIG. 15 is a plan view illustrating a configuration example of a pixel array unit according to the second embodiment of the present technology.

FIG. 15 is a plan view illustrating a configuration example of a pixel array unit 220 according to the second embodiment of the present technology. The figure shows a plan view when viewed in the Z-axis direction. The pixel array unit 220 of the second embodiment is divided into a plurality of electrode sharing blocks 305. A predetermined number of pixels 300 are arranged in each electrode sharing block 305. For example, four pixels 300 are arranged in 2 rows×2 columns. The four pixels in the electrode sharing block 305 share one additional cathode 331. The additional cathode 331 is disposed in a rectangular region including corners of the pixels in the boundary between the pixels. A dotted line in the figure indicates a boundary between the pixels.

The number of pixels in the electrode sharing block 305 is not limited to 4 pixels and may be 2 pixels or the like.

Figures 16A, 16B:
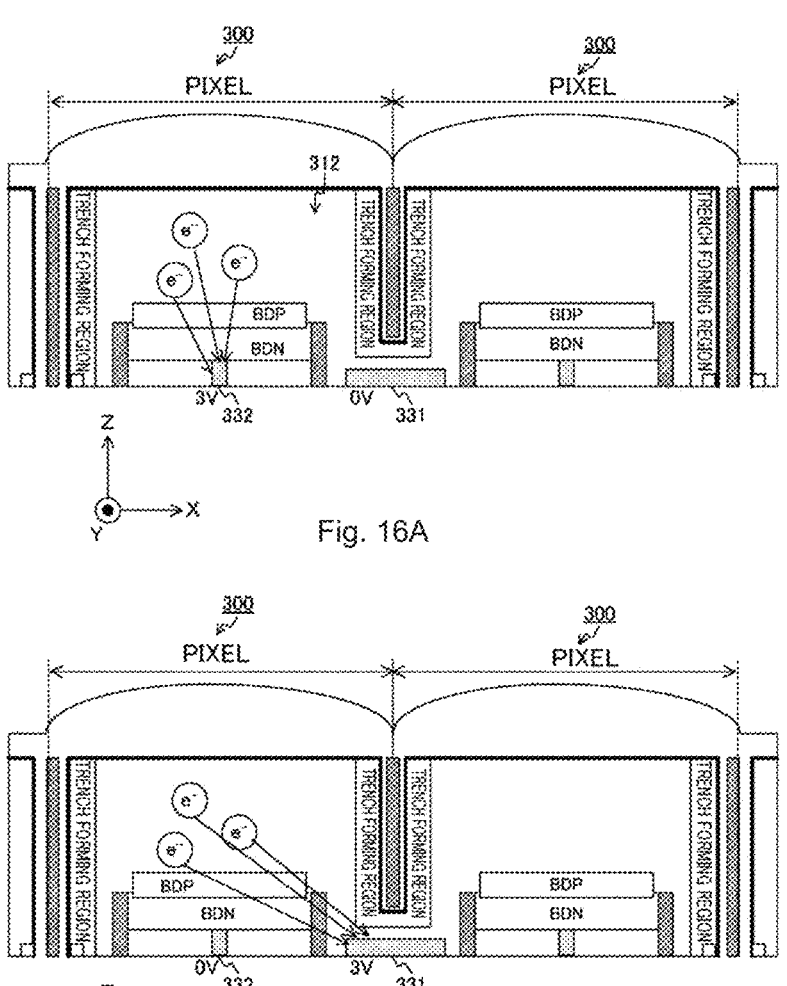
FIGS. 16A and 16B are diagrams illustrating a driving method of the pixel according to the second embodiment of the present technology.

FIGS. 16A and 16B are diagrams illustrating a driving method of the pixel 300 according to the second embodiment of the present technology. FIG. 16A is a cross-sectional view showing the state of the pixel 300 at the incidence timing of the reflected light, and FIG. 16B is a cross-sectional view showing the state of the pixel 300 at the time of quenching and recharging.

As illustrated in FIG. 16A, within a period in which the reflected light is incident, the control circuit 210 applies, for example, a potential of "3" volt (V) and a potential of "0" volt (V) to the cathode 332 and the additional cathode 331, respectively. By this potential control, the electrons do not move to the additional cathode 331, but are multiplied in the multiplication region (the BDP region 321 and the BDN region 322) and are output from the cathode 332.

Further, as illustrated in FIG. 16B, the control circuit 210 applies a potential of "0" volt (V) to the cathode 332 and applies a potential of "3" volt (V) to the additional cathode 331 at the time of quenching and recharging. By this potential control, the electrons are discharged from the additional cathode 331, and it is possible to shorten the time until the dropped potential is restored. In a case where an additional anode is disposed as an additional electrode, a potential of "3" volt is applied to the anode and a potential of "0" volt is applied to the additional anode.

Figures 17A, 17B, 17C:
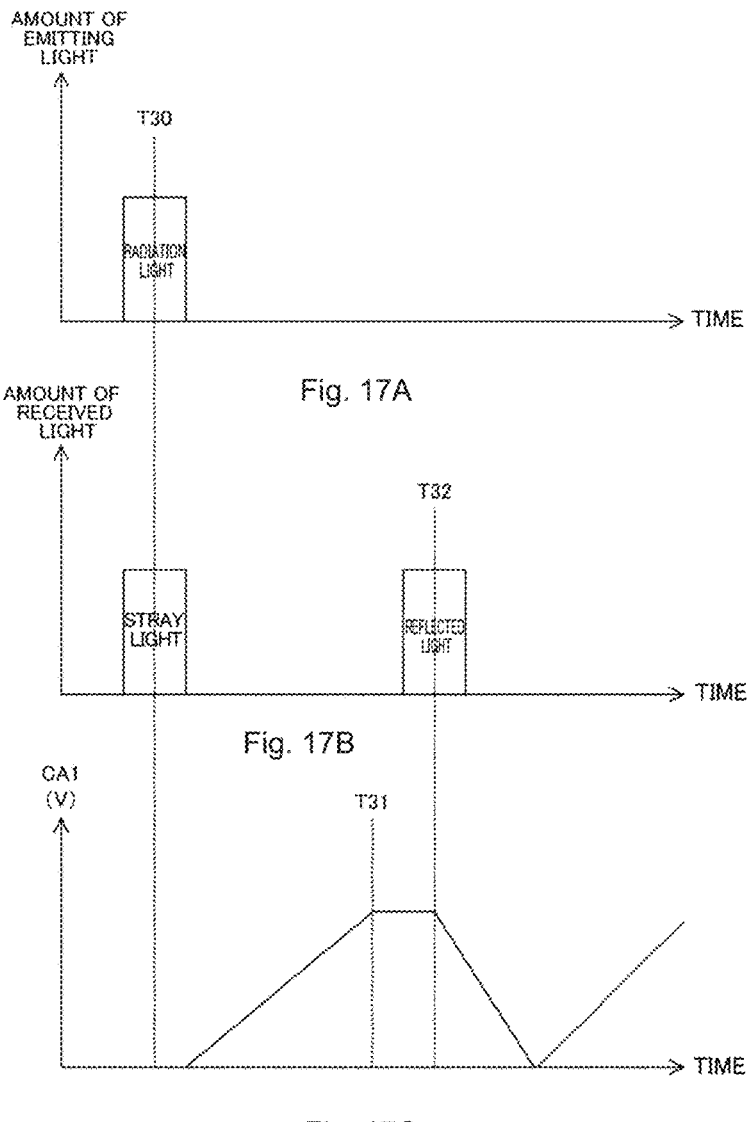
FIGS. 17A, 17B, and 17C are timing charts illustrating an example of an operation of a distance measurement module according to the second embodiment of the present technology.

FIGS. 17A, 17B, and 17C are timing charts illustrating an example of an operation of a distance measurement module according to the second embodiment of the present technology. FIG. 17A is a timing chart illustrating a light emitting operation of the light emitting unit 110. FIG. 17B is a timing chart illustrating fluctuation in amount of light received by the solid-state imaging element 200. FIG. 17C is a timing chart illustrating fluctuation of the cathode signal CA1.

As illustrated in FIG. 17A, the radiation light is radiated at the timing T30 and the stray light is incident on the solid-state imaging element 200. Further, at the timing T32, the reflected light is incident on the solid-state imaging element 200.

At the timing T30, the cathode signal CA1 drops under the control of the enable signal APDEN and restores to the original voltage by a recharging operation from the timing T30 to the timing T31 as in the first modification example of the first embodiment. Then, at the timing T32, the cathode signal CA1 drops again due to the incidence of the reflected light.

Here, if the recharging operation is slow, the potential of the cathode signal CA1 may not be restored by the timing T32 at which the reflected light is incident, and the reflected light may not be detected. However, by the potential control illustrated in FIGS. 16A and 16B, it is possible to speed up the recharging operation, and thus it is possible to shorten the shortest distance that can be measured. For example, short distance measurement in the order of centimeters (cm) can be realized.

Figure 18A:
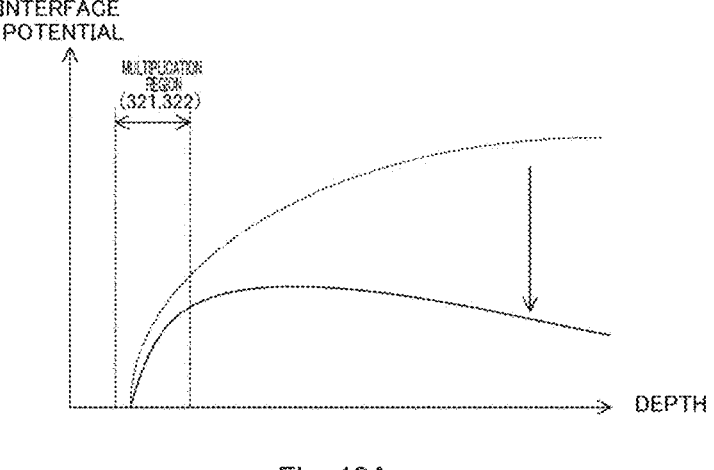
FIGS. 18A and 18B are examples of a potential diagram of the pixel according to the second embodiment of the present technology.
Figure 18B:
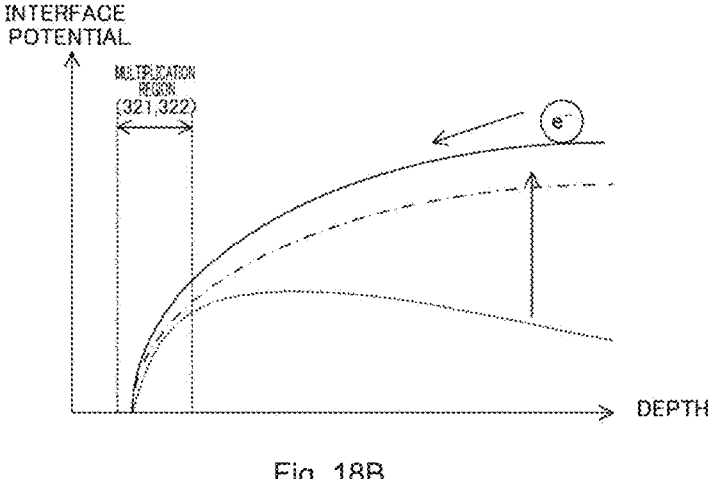

FIGS. 18A and 18B are examples of a potential diagram of the pixel 300 according to the second embodiment of the present technology. FIG. 18A is a potential diagram of the pixel 300 at the radiation timing, and FIG. 18B is a potential diagram of the pixel 300 at the light receiving timing of the reflected light. In the figure, a vertical axis represents an interface potential, and a horizontal axis represents a depth of the pixel 300 from a light receiving surface.

As illustrated in FIGS. 18A and 18B, a potential locus changes in a process of recharging from the radiation timing to the light receiving timing of the reflected light. Further, the alternate long and short dash line in FIG. 18B shows a potential of a comparative example without the additional cathode 331.

In the comparative example, the potential is relatively shallow and it is difficult for electrons to flow to the multiplication region 320, but by disposing the additional cathode 331, the potential becomes deep and the electrons easily flow to the multiplication region 320 when the reflected light is incident. As a result, it is possible to speed up the recharging operation.

As described above, in the second embodiment of the present technology, the additional cathode 331 is disposed in the region of the boundary between the adjacent pixels, it is not necessary to provide a space for the additional cathode 331 in the pixel 300, and it is easy to miniaturize the pixel.

FIRST MODIFICATION EXAMPLE

In the second embodiment described above, the additional cathode 331 is shared by a plurality of pixels, but if the number of pixels for sharing is large, the charge discharging capacity per pixel may be insufficient. A solid-state imaging element 200 of a first modification example of the second embodiment is different from that of the second embodiment in that the additional cathode 331 is provided for each pixel.

Figure 19:
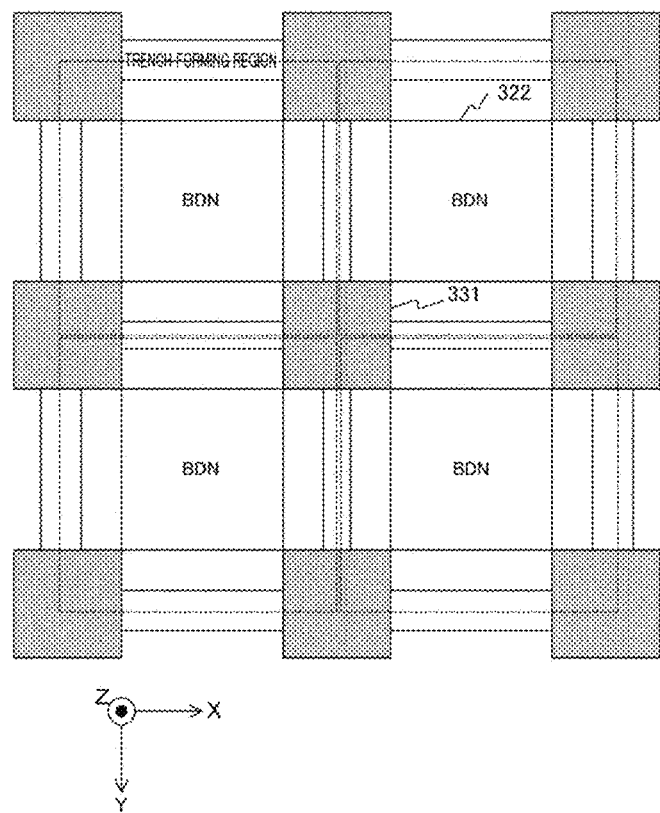
FIG. 19 is a plan view illustrating a configuration example of a pixel array unit according to a first modification example of the second embodiment of the present technology.

FIG. 19 is a plan view illustrating a configuration example of a pixel array unit 220 according to the first modification example of the second embodiment of the present technology. In the first modification example of the second embodiment, the additional cathode 331 is disposed for each pixel. For example, the additional cathode 331 is disposed at each of four corners of the pixel 300. Any one of the four additional cathodes 331 around a pixel 300 corresponds to the additional cathode 331 corresponding to the pixel 300. As described above, by disposing the additional cathode 331 for each pixel, it is possible to improve the charge discharge capacity per pixel as compared with the case of sharing.

Figure 20:
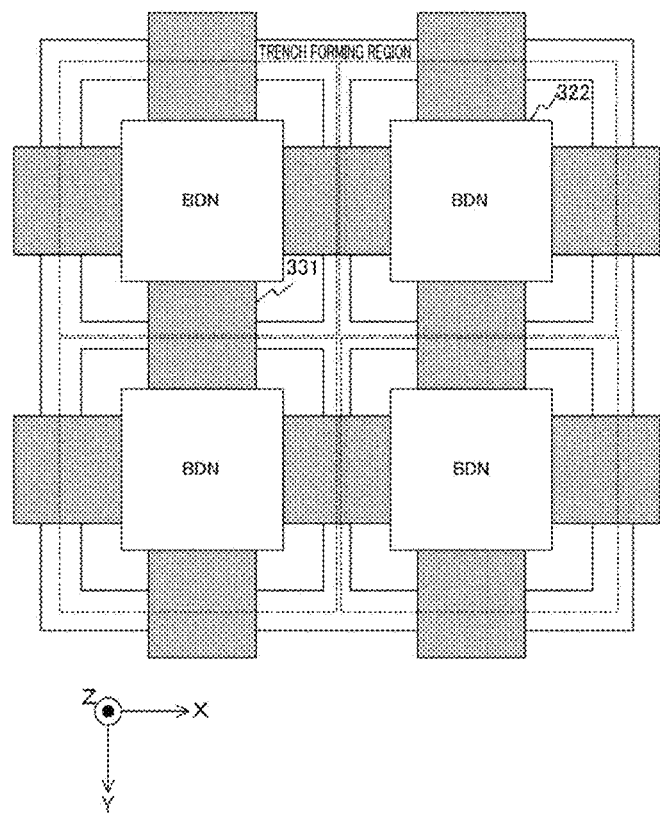
FIG. 20 is a plan view illustrating another example of the pixel array unit according to the first modification example of the second embodiment of the present technology.

Although the additional cathode 331 is disposed in the region including the corners of the pixels, the present invention is not limited to this configuration. As illustrated in FIG. 20, the additional cathode 331 can also be disposed in a rectangular region not including corners and including sides in the boundary between the pixels.

As described above, in the first modification example of the second embodiment of the present technology, the additional cathode 331 is disposed for each pixel, and thus it is possible to improve the charge discharge capacity per pixel as compared with the case of sharing the additional cathode 331.

SECOND MODIFICATION EXAMPLE

In the second embodiment described above, the additional cathode 331 is shared by four pixels 300, but if the number of pixels for sharing is large, the charge discharging capacity per pixel may be insufficient. A solid-state imaging element 200 of a second modification example of the second embodiment is different from that of the second embodiment in that the number of pixels sharing the additional cathode 331 is reduced.

Figure 21:
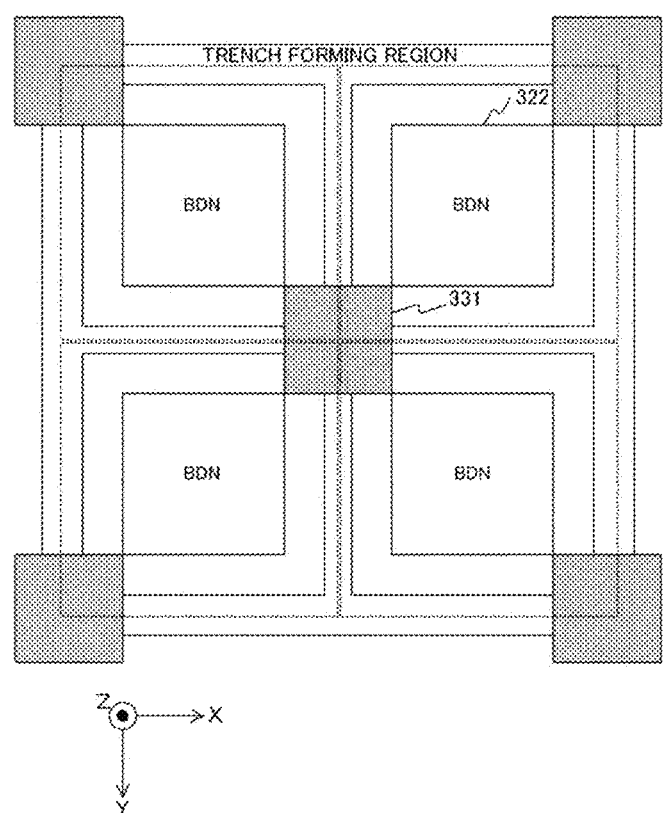
FIG. 21 is a plan view illustrating a configuration example of a pixel array unit according to a second modification example of the second embodiment of the present technology.

FIG. 21 is a plan view illustrating a configuration example of a pixel array unit 220 according to the second modification example of the second embodiment of the present technology. In the second modification example of the second embodiment, two pixels are disposed for each pixel sharing block, and these two pixels share the additional cathode 331. Further, the additional cathode 331 is disposed at two corners facing each other among the four corners of the pixel. In this disposition, two diagonally adjacent pixels share the additional cathode 331 between them.

As described above, in the second modification example of the second embodiment of the present technology, the number of the pixels sharing the additional cathode 331 is reduced to two, and thus it is possible to improve the charge discharge capacity per pixel.

THIRD MODIFICATION EXAMPLE

In the second embodiment described above, the anode is connected to the metal 343 between the pixels, but the anode may be embedded in the pixels. A solid-state imaging element 200 of a third modification example of the second embodiment is different from that of the second embodiment in that the anode is embedded in the pixel.

Figure 22:
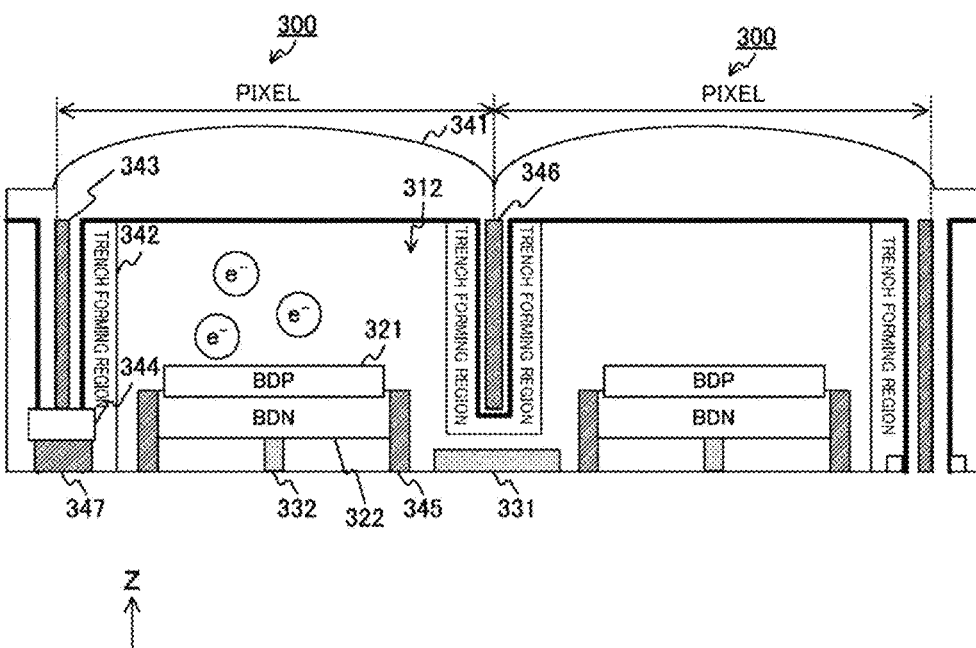
FIG. 22 is a cross-sectional view illustrating a configuration example of a pixel according to a third modification example of the second embodiment of the present technology.

FIG. 22 is a cross-sectional view illustrating a configuration example of a pixel 300 according to the third modification example of the second embodiment of the present technology. Further, in the third modification example of the second embodiment, in the trench forming region 342, a trench having a depth similar to that of the portion above the additional cathode 331 is formed in a region other than the portion above the additional cathode 331, and the metal 343 is embedded. A contact 344 containing a P-type impurity is provided below the metal 343. The STI is formed below the contact 344, and the anode 347 is embedded in the STI. As described above, by embedding the anode 347 at the boundary between pixels, it is not necessary to change the depth of the trench in a portion above the anode and a portion above the additional cathode 331, and it is possible to reduce the number of steps for forming the pixel 300.

In addition, the first or second modification example of the second embodiment may be applied to the third modification example of the second embodiment.

As described above, in the third modification example of the second embodiment of the present technology, since the anode 347 is embedded at the boundary between pixels, it is not necessary to change the depth of the trench, and it is possible to reduce the number of steps for forming the pixel 300.

FOURTH MODIFICATION EXAMPLE

In the third modification example of the second embodiment described above, the STI 345 is provided between the cathode 332 and the additional cathode 331 to separate them, but a semiconductor region having a polarity different from that of the cathode 332 and the additional cathode 331 may be provided between them. A solid-state imaging element 200 of a fourth modification example of the second embodiment is different from that of the third modification example of the second embodiment in that a semiconductor region having a polarity different from that of the cathode 332 and the additional cathode 331 is provided between them.

Figure 23:
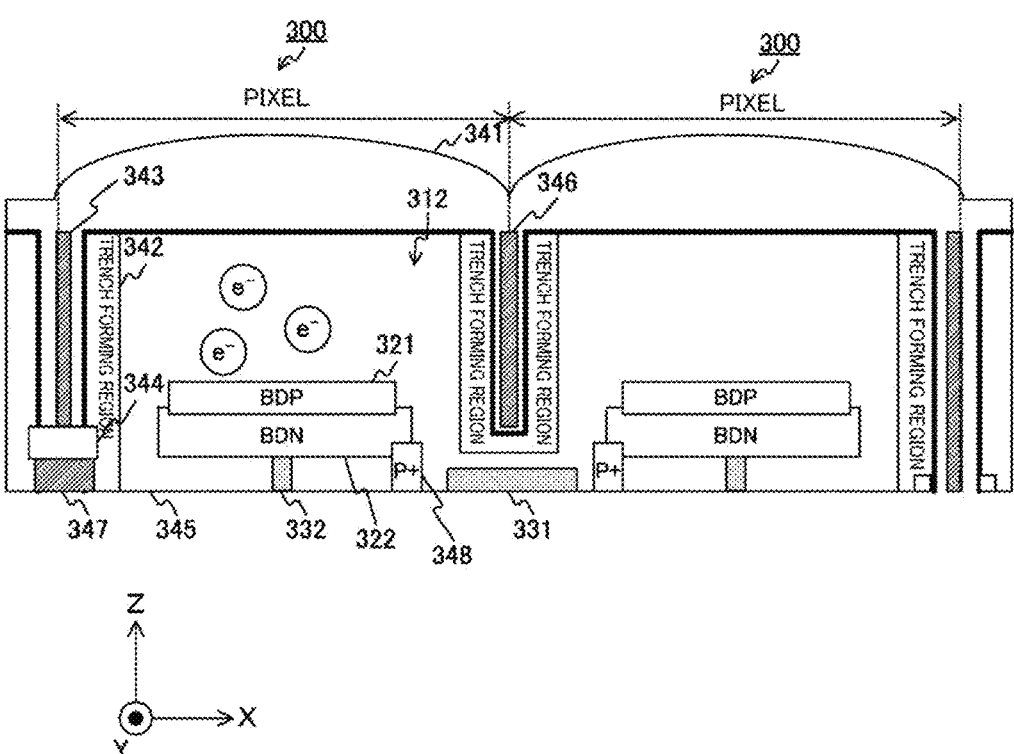
FIG. 23 is a cross-sectional view illustrating a configuration example of a pixel according to a fourth modification example of the second embodiment of the present technology.

FIG. 23 is a cross-sectional view illustrating a configuration example of a pixel 300 according to the fourth modification example of the second embodiment of the present technology. The pixel 300 of the fourth modification example of the second embodiment is different from that of the third modification example of the second embodiment in that a P$^+$ region 348 is formed between the cathode 332 and the additional cathode 331 instead of the STI 345.

Further, the cathode 332 and the additional cathode 331 are formed of an N-type semiconductor. The P$^+$ region 348 is formed of a P-type semiconductor having a different polarity from the cathode 332 and the additional cathode 331.

Figure 24:
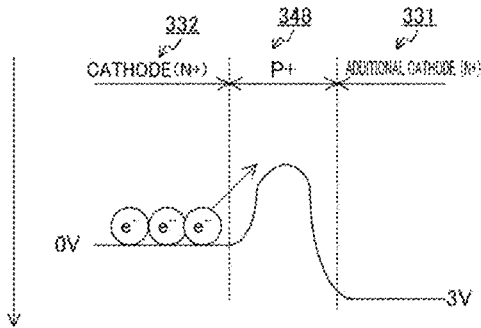
FIG. 24 is an example of a potential diagram of the pixel according to the fourth modification example of the second embodiment of the present technology.

FIG. 24 is an example of a potential diagram of the pixel 300 according to the fourth modification example of the second embodiment of the present technology. As illustrated in the figure, the potential of the P$^+$ region 348 between the cathode 332 and the additional cathode 331 is lower than that of the N-type cathode 332 and additional cathode 331. Therefore, electrons do not flow from the cathode 332 to the additional cathode 331, and the cathode 332 and the additional cathode 331 are electrically separated from each other.

As illustrated in FIGS. 23 and 24, by separating the cathode 332 and the additional cathode 331 from each other by the P$^+$ region 348, it is not necessary to form the STI 345, and it is possible to further reduce the number of steps.

The fourth modification example of the second embodiment may be applied to the second embodiment in which the depths of the trenches are not aligned. In addition, the first or second modification example of the second embodiment may be applied to the fourth modification example of the second embodiment.

As described above, in the fourth modification example of the second embodiment of the present technology, a semiconductor region having a polarity different from that of the cathode 332 and the additional cathode 331 is formed between them, and thus it is not necessary to form the STI 345, and it is possible to further reduce the number of steps.

3. Application Example to Moving Body

The technology according to the present disclosure (the present technology) can be applied to various products. For example, the technology according to the present disclosure may be realized as a device equipped in any type of moving body such as an automobile, an electric vehicle, a hybrid electric vehicle, a motorcycle, a bicycle, a personal mobility device, an airplane, a drone, a ship, and a robot.

Figure 25:
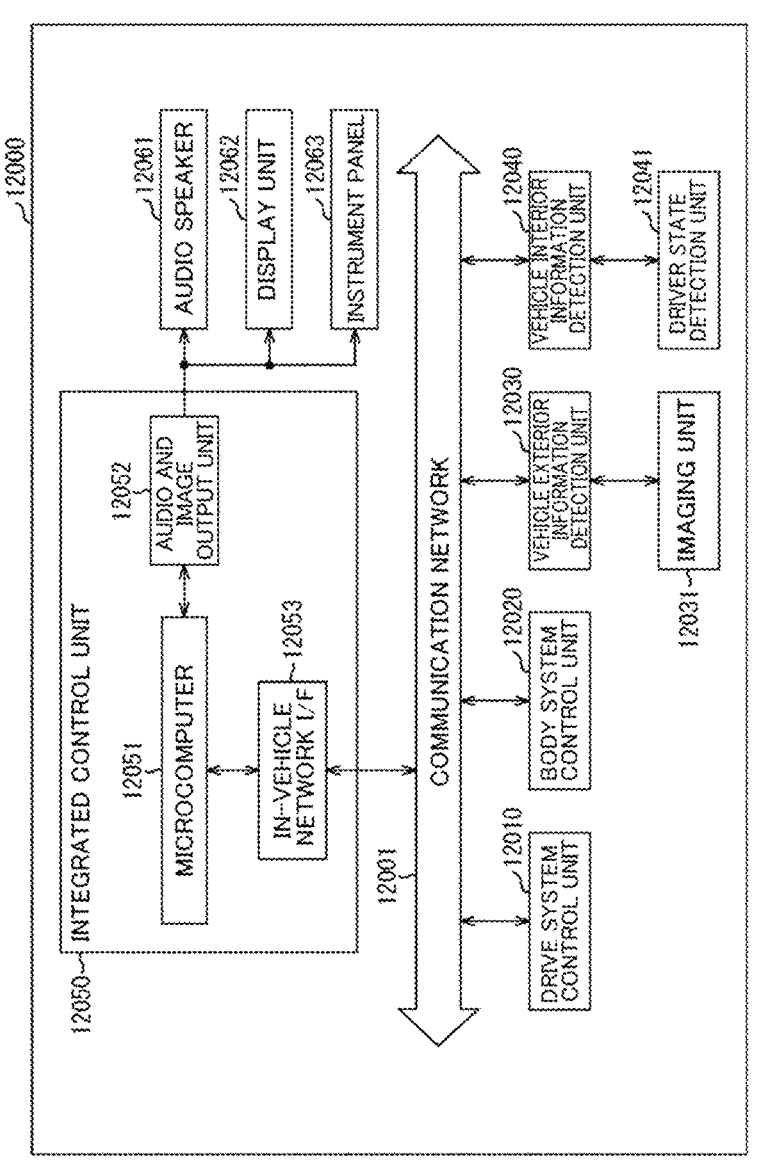
FIG. 25 is a block diagram illustrating a schematic configuration example of a vehicle control system.

FIG. 25 is a block diagram illustrating a schematic configuration example of a vehicle control system which is an example of a moving body control system to which the technology according to the present disclosure can be applied.

The vehicle control system 12000 includes a plurality of electronic control units connected thereto via a communication network 12001. In the example illustrated in FIG. 25, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, an audio and image output unit 12052, and an in-vehicle network interface (I/F) 12053 are shown.

The drive system control unit 12010 controls operations of devices related to a drive system of a vehicle according to various programs. For example, the drive system control unit 12010 functions as a control device such as a driving force generation device for generating a driving force of a vehicle such as an internal combustion engine or a driving motor, a driving force transmission mechanism for transmitting a driving force to wheels, a steering mechanism for adjusting a turning angle of a vehicle, and a braking device for generating a braking force of a vehicle.

The body system control unit 12020 controls operations of various devices mounted in the vehicle body according to various programs. For example, the body system control unit 12020 functions as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, and a lamp of the vehicle.

The vehicle exterior information detection unit 12030 detects information on the outside of the vehicle equipped with the vehicle control system 12000. For example, an imaging unit 12031 is connected to the vehicle exterior information detection unit 12030. The vehicle exterior information detection unit 12030 causes the imaging unit 12031 to capture an image of the outside of the vehicle and receives the captured image. The vehicle exterior information detection unit 12030 may perform object detection processing or distance detection processing for peoples, cars, obstacles, signs, and letters on the road on the basis of the received image.

The imaging unit 12031 is an optical sensor that receives light and outputs an electrical signal according to the amount of the received light. The imaging unit 12031 can also output the electrical signal as an image or distance measurement information. In addition, the light received by the imaging unit 12031 may be visible light or invisible light such as infrared light.

The vehicle interior information detection unit 12040 detects information on the inside of the vehicle. For example, a driver state detection unit 12041 that detects a driver's state is connected to the vehicle interior information detection unit 12040. The driver state detection unit 12041 includes, for example, a camera that captures an image of a driver, and the vehicle interior information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generation device, the steering mechanism, or the braking device on the basis of the information on the outside or the inside of the vehicle acquired by the vehicle exterior information detection unit 12030 or the vehicle interior information detection unit 12040 and output a control command to the drive system control unit 12010. For example, the microcomputer 12051 can perform cooperative control for the purpose of realizing functions of an advanced driver assistance system (ADAS) including collision avoidance or impact mitigation of a vehicle, following traveling based on inter-vehicle distance, vehicle speed maintenance driving, vehicle collision warning, vehicle lane deviation warning, or the like.

Further, the microcomputer 12051 can perform cooperative control for the purpose of automated driving or the like in which autonomous travel is performed without depending on operations of the driver by controlling the driving force generation device, the steering mechanism, the braking device, or the like on the basis of information on the surroundings of the vehicle acquired by the vehicle exterior information detection unit 12030 or the vehicle interior information detection unit 12040.

In addition, the microcomputer 12051 can output a control command to the body system control unit 12020 on the basis of the information on the outside of the vehicle acquired by the vehicle exterior information detection unit 12030. For example, the microcomputer 12051 can perform cooperative control for the purpose of preventing glare, such as switching from a high beam to a low beam, by controlling the headlamp according to the position of a preceding vehicle or an oncoming vehicle detected by the vehicle exterior information detection unit 12030.

The audio and image output unit 12052 transmits an output signal of at least one of an audio and an image to an output device capable of visually or audibly notifying an occupant of a vehicle or the outside of the vehicle of information. In the example of FIG. 25, an audio speaker 12061, a display unit 12062, and an instrument panel 12063 are illustrated as the output device. The display unit 12062 may include, for example, at least one of an onboard display and a head-up display.

Figure 26:
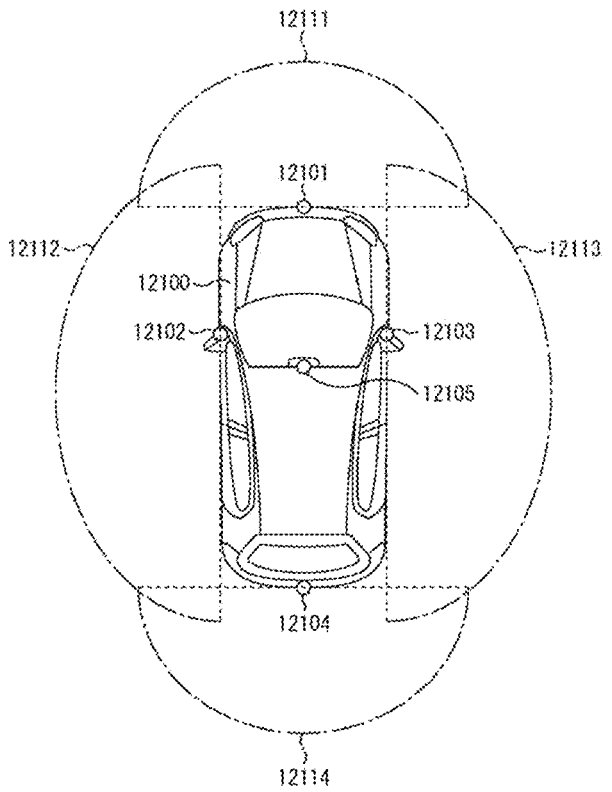
FIG. 26 is an explanatory diagram illustrating an example of an installation position of an imaging unit.

FIG. 26 is a diagram illustrating an example of an installation position of the imaging unit 12031.

In FIG. 26, imaging units 12101, 12102, 12103, 12104, and 12105 are provided as the imaging unit 12031.

The imaging units 12101, 12102, 12103, 12104, and 12105 may be provided at positions such as a front nose, side-view mirrors, a rear bumper, a back door, and an upper portion of a windshield in a vehicle interior of the vehicle 12100, for example. The imaging unit 12101 provided on the front nose and the imaging unit 12105 provided in the upper portion of the windshield in the vehicle interior mainly acquire images of a side in front of the vehicle 12100. The imaging units 12102 and 12103 provided on the side-view mirrors mainly acquire images of lateral sides from the vehicle 12100. The imaging unit 12104 provided on the rear bumper or the back door mainly acquires images of a side behind the vehicle 12100. The imaging unit 12105 provided in the upper portion of the windshield in the vehicle interior is mainly used for detection of preceding vehicles, pedestrians, obstacles, traffic signals, traffic signs, lanes, and the like.

FIG. 26 illustrates an example of imaging ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side-view mirrors, and an imaging range 12114 indicates the imaging range of the imaging unit 12104 provided at the rear bumper or the back door. For example, a bird's-eye view image of the vehicle 12100 as viewed from above can be obtained by superimposition of image data captured by the imaging units 12101 to 12104.

At least one of the imaging units 12101 to 12104 may have a function for obtaining distance information. For example, at least one of the imaging units 12101 to 12104 may be a stereo camera constituted by a plurality of imaging elements or may be an imaging element that has pixels for phase difference detection.

For example, the microcomputer 12051 can extract, particularly, a closest three-dimensional object on a path along which the vehicle 12100 is traveling, which is a three-dimensional object traveling at a predetermined speed (for example, 0 km/h or higher) in the substantially same direction as the vehicle 12100, as a preceding vehicle by acquiring a distance to each of three-dimensional objects in the imaging ranges 12111 to 12114 and temporal change in the distance (a relative speed with respect to the vehicle 12100) on the basis of the distance information obtained from the imaging units 12101 to 12104. Further, the microcomputer 12051 can set an inter-vehicle distance which should be secured in front of the vehicle in advance with respect to the preceding vehicle and can perform automated brake control (also including following stop control) or automated acceleration control (also including following start control). In this way, it is possible to perform cooperative control for the purpose of automated driving or the like in which a vehicle autonomously travels without depending on operations of the driver.

For example, the microcomputer 12051 can classify and extract three-dimensional object data regarding three-dimensional objects into two-wheeled vehicles, ordinary vehicles, large vehicles, pedestrians, and other three-dimensional objects such as utility poles on the basis of the distance information obtained from the imaging units 12101 to 12104 and can use the three-dimensional object data for automatic avoidance of obstacles. For example, the microcomputer 12051 identifies obstacles in the vicinity of the vehicle 12100 into obstacles that can be visually recognized by the driver of the vehicle 12100 and obstacles that are difficult to be visually recognized by the driver. Then, the microcomputer 12051 can determine a risk of collision indicating the degree of risk of collision with each obstacle and can perform driving assistance for collision avoidance by outputting a warning to the driver through the audio speaker 12061 or the display unit 12062 and performing forced deceleration or avoidance steering through the drive system control unit 12010 when the risk of collision has a value equal to or greater than a set value and there is a possibility of collision.

At least one of the imaging units 12101 to 12104 may be an infrared camera that detects infrared rays. For example, the microcomputer 12051 can recognize a pedestrian by determining whether there is a pedestrian in the captured images of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating the outline of the object and it is determined whether the object is a pedestrian. When the microcomputer 12051 determines that there is a pedestrian in the captured images of the imaging units 12101 to 12104, and the pedestrian is recognized, the audio and image output unit 12052 controls the display unit 12062 such that the recognized pedestrian is superimposed and displayed with a square contour line for emphasis. In addition, the audio and image output unit 12052 may control the display unit 12062 such that an icon or the like indicating a pedestrian is displayed at a desired position.

An example of the vehicle control system to which the technology according to the present disclosure can be applied has been described above. The technology according to the present disclosure can be applied to, for example, the vehicle exterior information detection unit 12030 among the above-described components. Specifically, the distance measurement module 100 of FIG. 1 can be applied to the vehicle exterior information detection unit 12030. By applying the technology according to the present disclosure to the vehicle exterior information detection unit 12030, it is possible to shorten the shortest distance that can be measured and to acquire accurate distance information particularly for a short distance.

Meanwhile, the above-described embodiments show examples for embodying the present technology, and matters in the embodiments and matters specifying the invention in the claims have a corresponding relationship with each other. Similarly, the matters specifying the invention in the claims and the matters in the embodiments of the present technology having the same name have a corresponding relationship with each other. However, the present technology is not limited to the embodiments and can be embodied by applying various modifications to the embodiments without departing from the gist thereof.

In addition, the effects described in the present specification are merely examples and are not intended as limiting, and other effects may be obtained.

The present technology can also have the following configurations.

(1) A solid-state imaging element including:

a photoelectric conversion region that generates charges through photoelectric conversion;

a multiplication region that multiplies the generated charges;

an output electrode that outputs the multiplied charges;

a detection circuit that detects the presence or absence of photons contained in reflected light with respect to radiation light on the basis of the charges output from the output electrode;

an additional electrode that discharges the charges from the photoelectric conversion region in a case where a predetermined potential is applied; and a control circuit that applies the predetermined potential to the additional electrode at a radiation timing when the radiation light is radiated.

(2) The solid-state imaging element according to (1), wherein the output electrode and the additional electrode are cathodes, and wherein the charges are electrons.

(3) The solid-state imaging element according to (1) or (2), wherein the detection circuit includes a current source, a transistor in which an enable signal is input to a gate, and a logic gate that outputs a pulse signal on the basis of a potential of a connection node between the current source and the transistor, wherein the current source and the transistor are connected in series between a power source node and a reference node, and wherein the output electrode is connected to the connection node.

(4) The solid-state imaging element according to (3), wherein the control circuit applies the predetermined potential over a predetermined period to control the transistor to be in an on state with the enable signal over a period from a start timing of the predetermined period to a predetermined timing before an end timing of the predetermined period.

(5) The solid-state imaging element according to (3) or (4), further comprising a signal processing unit that calculates a distance on the basis of the pulse signal.

(6) The solid-state imaging element according to (5), wherein the signal processing unit acquires a reference distance on the basis of the pulse signal within a predetermined reference distance measurement period, calculates a distance on the basis of the pulse signal within a predetermined distance measurement period, and corrects the distance on the basis of the reference distance.

(7) The solid-state imaging element according to (5), wherein the photoelectric conversion region, the multiplication region, the output electrode, the detection circuit, and the additional electrode are disposed in each of a reference pixel and a distance measurement pixel, and wherein the signal processing unit acquires a reference distance on the basis of the pulse signal from the reference pixel, calculates a distance on the basis of the pulse signal from the distance measurement pixel, and corrects the distance on the basis of the reference distance.

(8) An electronic device including:

a light emitting unit that radiates radiation light;

a photoelectric conversion region that generates charges through photoelectric conversion;

a multiplication region that multiplies the generated charges;

an output electrode that outputs the multiplied charges;

a detection circuit that detects the presence or absence of photons contained in reflected light with respect to the radiation light on the basis of the charges output from the output electrode;

an additional electrode that discharges the charges from the photoelectric conversion region in a case where a predetermined potential is applied to the additional electrode; and a control circuit that applies the predetermined potential to the additional electrode at a radiation timing when the radiation light is radiated.

(9) A solid-state imaging element including:

a pixel array unit in which a plurality of pixels in each of which a photoelectric conversion region that generates charges through photoelectric conversion, a multiplication region that multiplies the generated charges, and an output electrode that outputs the multiplied charges are disposed are arranged; and an additional electrode that is disposed in a region including a boundary between the plurality of pixels and discharges the charges from the photoelectric conversion region.

(10) The solid-state imaging element according to (9), wherein the pixel array unit is divided into a plurality of sharing blocks in each of which a predetermined number of pixels are disposed, and wherein, in each of the plurality of sharing blocks, the predetermined number of pixels share the additional electrode.

(11) The solid-state imaging element according to (10), wherein four pixels are disposed in each of the plurality of sharing blocks.

(12) The solid-state imaging element according to (10), wherein two pixels are disposed in each of the plurality of sharing blocks.

(13) The solid-state imaging element according to (9), wherein the additional electrode is disposed for each pixel.

(14) The solid-state imaging element according to any one of (9) to (13), wherein the additional electrode is disposed in a region including corners of the pixels in the boundary.

(15) The solid-state imaging element according to (9), wherein the additional electrode is disposed in a region not including corners of the pixel and including sides of the pixels in the boundary.

(16) The solid-state imaging element according to any one of (9) to (15), wherein the output electrode and the additional electrode are cathodes, and wherein each of the plurality of pixels is further provided with an anode embedded in the boundary.

(17) The solid-state imaging element according to any one of (9) to (16), wherein a predetermined semiconductor region is disposed between the output electrode and the additional electrode, and wherein the output electrode and the additional electrode are formed of a semiconductor having a polarity different from that of the semiconductor region.

(18) An electronic device including:

a light emitting unit that radiates radiation light;

a pixel array unit in which a plurality of pixels in each of which a photoelectric conversion region that generates charges through photoelectric conversion, a multiplication region that multiplies the generated charges, and an output electrode that outputs the multiplied charges are disposed are arranged; and an additional electrode that is disposed in a region including a boundary between the plurality of pixels and discharges the charges from the photoelectric conversion region.

REFERENCE SIGNS LIST

100 Distance measurement module
110 Light emitting unit
120 Synchronization control unit
200 Solid-state imaging element
201 Pixel chip
202 Circuit chip
210 Control circuit
211 Pulse signal generation unit
212 Pulse width adjustment unit
213, 214 Driver
220 Pixel array unit
230 Signal processing unit
231 TDC
232 Distance data generation unit
300 Pixel
301 Reference pixel
302 Distance measurement pixel
305 Electrode sharing block
310 SPAD
311, 347 Anode
312 Photoelectric conversion region
320 Multiplication region
321 BDP region
322 BDN region
331 Additional cathode
332 Cathode
341 Microlens
342 Trench forming region
343, 346 Metal
344 Contact
345 STI
348 P+ region
350 Quench circuit
351 Current source
352 Buffer
353 nMOS transistor
501 Object
12030 Vehicle exterior information detection unit

The invention claimed is:

1. A solid-state imaging element, comprising:

a photoelectric conversion region configured to generate charges through photoelectric conversion;

a multiplication region configured to multiply the generated charges;

an output electrode configured to output the multiplied charges;

a detection circuit configured to detect a presence or an absence of photons contained in reflected light with respect to radiation light based on the charges output from the output electrode;

an additional electrode configured to discharge the charges from the photoelectric conversion region in a case where a specific potential is applied; and a control circuit configured to apply the specific potential to the additional electrode at a radiation timing in a case where the radiation light is radiated, wherein the detection circuit includes:

a current source, a transistor in which an enable signal is input to a gate, and a logic gate that outputs a pulse signal based on a potential of a connection node between the current source and the transistor, wherein the current source and the transistor are connected in series between a power source node and a reference node, and the output electrode is connected to the connection node.

2. The solid-state imaging element according to claim 1, wherein the output electrode and the additional electrode are cathodes, and the charges are electrons.

3. The solid-state imaging element according to claim 1, wherein the control circuit is further configured to apply the specific potential over a specific period to control the transistor to be in an on state with the enable signal over a period from a start timing of the specific period to a specific timing before an end timing of the specific period.

4. The solid-state imaging element according to claim 1, further comprising a signal processing unit configured to calculate a distance based on the pulse signal.

5. The solid-state imaging element according to claim 4, wherein the signal processing unit is further configured to:

acquire a reference distance based on the pulse signal within a specific reference distance measurement period, calculate a distance based on the pulse signal within a specific distance measurement period, and correct the distance based on the reference distance.

6. The solid-state imaging element according to claim 4, wherein the photoelectric conversion region, the multiplication region, the output electrode, the detection circuit, and the additional electrode are in each of a reference pixel and a distance measurement pixel, and the signal processing unit is further configured to:

acquire a reference distance based on the pulse signal from the reference pixel, calculate a distance based on the pulse signal from the distance measurement pixel, and correct the distance based on the reference distance.

7. An electronic device, comprising:

a light emitting unit configured to radiate radiation light;

a photoelectric conversion region configured to generate charges through photoelectric conversion;

a multiplication region configured to multiply the generated charges;

an output electrode configured to output the multiplied charges;

a detection circuit configured to detect a presence or an absence of photons contained in reflected light with respect to the radiation light based on the charges output from the output electrode;

an additional electrode configured to discharge the charges from the photoelectric conversion region in a case where a specific potential is applied to the additional electrode; and a control circuit configured to apply the specific potential to the additional electrode at a radiation timing in a case where the radiation light is radiated, wherein the detection circuit includes:

a current source, a transistor in which an enable signal is input to a gate, and a logic gate that outputs a pulse signal based on a potential of a connection node between the current source and the transistor, wherein the current source and the transistor are connected in series between a power source node and a reference node, and the output electrode is connected to the connection node.

8. A solid-state imaging element, comprising:

a pixel array unit including a plurality of pixels, wherein each of the plurality of pixels includes:

a photoelectric conversion region configured to generate charges through photoelectric conversion, a multiplication region configured to multiply the generated charges, and an output electrode configured to output the multiplied charges;

a detection circuit configured to detect a presence or an absence of photons contained in reflected light with respect to radiation light based on the charges output from the output electrode, wherein the detection circuit includes:

a current source, a transistor in which an enable signal is input to a gate, and a logic gate that outputs a pulse signal based on a potential of a connection node between the current source and the transistor, wherein the current source and the transistor are connected in series between a power source node and a reference node, and the output electrode is connected to the connection node; and an additional electrode in a region including a boundary between the plurality of pixels, wherein the additional electrode is configured to discharge the charges from the photoelectric conversion region.

9. The solid-state imaging element according to claim 8, wherein the pixel array unit is divided into a plurality of sharing blocks, each of the plurality of sharing blocks includes a specific number of pixels, and each of the plurality of sharing blocks includes the specific number of pixels share the additional electrode.

10. The solid-state imaging element according to claim 9, wherein four pixels are in each of the plurality of sharing blocks.

11. The solid-state imaging element according to claim 9, wherein two pixels are in each of the plurality of sharing blocks.

12. The solid-state imaging element according to claim 8, wherein the additional electrode is for each pixel.

13. The solid-state imaging element according to claim 8, wherein the additional electrode is in a region including corners of the pixels in the boundary.

14. The solid-state imaging element according to claim 8, wherein the additional electrode is in a region not including corners of pixels of the plurality of pixels in the boundary.

15. The solid-state imaging element according to claim 8, wherein the output electrode and the additional electrode are cathodes, and each of the plurality of pixels includes an anode embedded in the boundary.

16. The solid-state imaging element according to claim 8, wherein a specific semiconductor region is between the output electrode and the additional electrode, and the output electrode and the additional electrode are formed of a semiconductor having a polarity different from that of the specific semiconductor region.

17. An electronic device, comprising:

a light emitting unit configured to radiate radiation light;

a pixel array unit including a plurality of pixels, wherein each of which the plurality of pixels includes:

a photoelectric conversion region configured to generate charges through photoelectric conversion, a multiplication region configured to multiply the generated charges, and an output electrode configured to output the multiplied charges are disposed are arranged;

a detection circuit configured to detect a presence or an absence of photons contained in reflected light with respect to radiation light based on the charges output from the output electrode, wherein the detection circuit includes a current source, a transistor in which an enable signal is input to a gate, and a logic gate that outputs a pulse signal based on a potential of a connection node between the current source and the transistor, wherein the current source and the transistor are connected in series between a power source node and a reference node, and the output electrode is connected to the connection node; and an additional electrode in a region including a boundary between the plurality of pixels, wherein the additional electrode is configured to discharge the charges from the photoelectric conversion region.

* * * * *